(12) United States Patent
Ragner

(10) Patent No.: US 7,059,182 B1
(45) Date of Patent: Jun. 13, 2006

(54) ACTIVE IMPACT PROTECTION SYSTEM

(76) Inventor: Gary Dean Ragner, 711 SW. 75th St. #103, Gainesville, FL (US) 32607

( * ) Notice: Subject to any disclaimer, the term of this patent is extended or adjusted under 35 U.S.C. 154(b) by 0 days.

(21) Appl. No.: 11/073,098

(22) Filed: Mar. 3, 2005

Related U.S. Application Data

(60) Provisional application No. 60/549,603, filed on Mar. 3, 2004.

(51) Int. Cl.
*G01F 15/08* (2006.01)
(52) U.S. Cl. .................................................. 73/200
(58) Field of Classification Search ............... None
See application file for complete search history.

(56) References Cited

U.S. PATENT DOCUMENTS

| | | | |
|---|---|---|---|
| 5,706,168 A * | 1/1998 | Erler et al. ............... | 361/685 |
| 5,982,573 A * | 11/1999 | Henze ...................... | 360/75 |
| 6,570,726 B1 * | 5/2003 | Mutoh ...................... | 360/60 |
| 6,612,157 B1 * | 9/2003 | Urano et al. ............. | 73/65.01 |
| 6,704,161 B1 * | 3/2004 | Pham et al. .............. | 360/97.02 |
| 6,771,449 B1 * | 8/2004 | Ito et al. .................... | 360/75 |
| 6,858,810 B1 * | 2/2005 | Zerbini et al. ........... | 200/61.08 |
| 2003/0035281 A1 * | 2/2003 | Huang et al. ............. | 361/801 |
| 2004/0066618 A1 * | 4/2004 | Layton et al. ............ | 361/683 |

OTHER PUBLICATIONS

Product literature from: www.oqo.com/hardware/specs/ teaching a portable device with freefall detection and parking of a hard drive head.

* cited by examiner

*Primary Examiner*—Max Noori
*Assistant Examiner*—Octavia Davis

(57) ABSTRACT

An impact protection system for a portable device, comprising a housing 20 with a plurality of impact absorbing arms 22 attached to housing 20 and having a retracted position and an extended position; an extension spring 26 connected to each arm provides forceful extension of the arms from their retracted position to their extended position; a free-fall detection sensor 30 defined within housing 20 for detecting dangerous free-fall conditions of the portable device and providing a signal to an activation controller 32 which is responsive to the free-fall detection sensor 30 and connected to the impact absorbing arms 22, whereby the arms are extended from their retracted position to their extended position upon detection of dangerous free-fall conditions to provide impact protection for the portable device.

22 Claims, 7 Drawing Sheets

ACTIVE IMPACT PROTECTION SYSTEM

CROSS-REFERENCE TO RELATED APPLICATIONS

Figure 1:
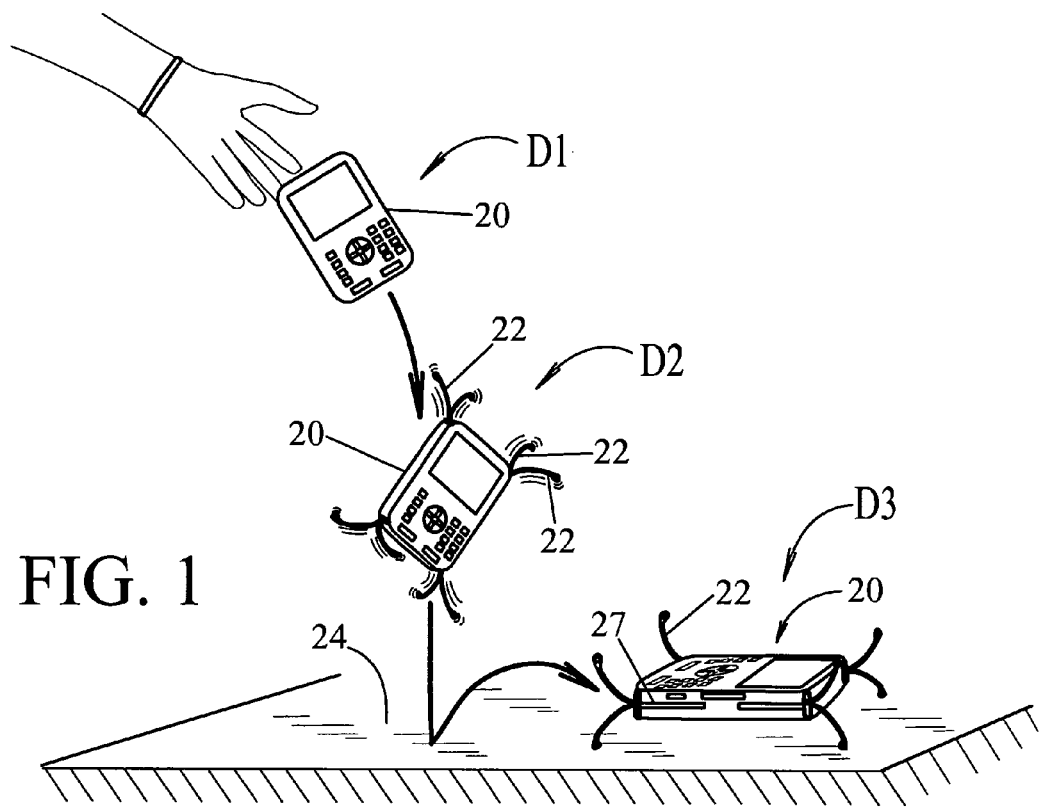

This utility application claims priority from U.S. Provisional application Ser. No. 60/549,603, filed on Mar. 3, 2004, titled: "Active Impact Protection System" and its contents to be fully included within this Utility Application.

BACKGROUND OF INVENTION

The field of this invention relates to impact protection systems that protect fragile devices from impact loads (i.e. dropping from a height), and more specifically to actively deployed impact protection system when a free fall situation is detected, to reduce peak impact forces on the device.

SUMMARY

Damage to portable devices from accidental dropping has always been a problem, whether it is your laptop computer you dropped or an item in a seagoing shipping container. When a breakable device sustains a hard impact, or high acceleration force loads, the impact forces on the device can be many times the actual weight of the device. The sudden change in kinetic energy stored in the device must be absorbed on impact. If the device's outer case has very little resilience then all the impact energy must be absorbed in a very short distance. This results in large peak accelerations and large peak forces exerted on the device, which increases the chances that the device and/or its internal systems will be damaged. Present systems include the use of padded corners on the device, but this adds significant volume and weight to the device, making it more bulky, which is a big disadvantage for modern electronic systems like laptop computers, PDAs, cellular phones, etc., where the smaller and lighter devices sell the best.

The disclosed impact protection system solves these problems while greatly increasing the impact resistance over the prior art. The disclosed invention comprises an impact protection system that deploys resilient arms away from the exterior of the portable device for protection. Sensors and a control circuit only activate the impact protection system when the system detects that the portable device is in a dangerous free-fall condition (a condition that could potentially cause damage to the portable device). This means that during normal use, the protection system is stowed waiting to be activated. And because impact absorbing mean (resilient arms) can extend a significant distance away from the device, very low force loads can be realized. This means the extended arms can be very light weight and do not have to be extremely stiff to provide a soft cushioning effect for the portable device. Other prior art impact protection systems do not have this luxury of large de-acceleration distances because they do not deploy their cushioning system away from the portable device itself. Instead they have static cushions, which take up space and interfere with normal operation of the device if it were made large enough to provide the same impact protection as the applicant's impact protection system does. The disclosed invention gets around prior art problem by extending the impact surfaces only when specific predetermined free-fall conditions are detected.

OBJECTIVES AND ADVANTAGES

Accordingly, several objects and advantages of my invention are:

a) To provide a light weight and compact impact protection system for portable devices, such as PDA units, Cell Phones, Laptop and other computers systems, cameras, camcorders, GPS units, Multi-meters, oscilloscopes, televisions, radios, CD players, containers for transporting fragile materials or equipment, specialized electronic equipment, etc. The impact protection system is even more beneficial where light-weight and small-volume are important.

b) To provide significantly greater stopping distances for impact protection compared to prior art, which results in lower peak impact forces than existing drop(impact) protection devices.

c) To provide an active impact protection system for a portable device that deploys an impact absorbing system when a predetermined set of dangerous free-fall condition(s) are detected.

d) To provide an active impact protection system for a portable device that deploys an impact absorbing system when a near zero acceleration is detected, in the device's inertial frame of reference, for a predetermined period of time.

e) To provide an active impact protection system for a portable device that deploys an impact absorbing system when the device exceeds a predetermined velocity.

f) To provide an impact protection system for portable equipment, which keeps track of the equipments free-fall velocity and activates an impact protection system when falling velocity and/or other conditions are met.

g) To provide an impact protection system for portable equipment which keeps track of the equipments free-fall velocity and activates a deploy able impact protection system when both the falling velocity exceeds a predetermined maximum and the inertial acceleration of the device is significantly below the acceleration of gravity.

h) To provide a free-fall protection system for a device that activates when it detects both low acceleration in the inertial frame of the device, and also very-low rates of change in acceleration (approx. constant acceleration) for a predetermined period of time. Very sensitive detection of changes in acceleration can provide sensitivity to vibrations from handling, carrying, etc. to reduce the chances of false activation.

i) To provide a free-fall protection system for a device that activates when it detects all three conditions of: 1) low acceleration in the inertial frame of the device, 2) very-low rates of change in acceleration (approx. constant acceleration), and 3) a vertical velocity and/or total velocity that is greater than a predetermined threshold velocity. If one or more of these conditions exist for a predetermined period of time the system can also initiate activation of the impact protection system.

j) To provide an impact protection system for a portable device comprising a capacitive sensor circuit (for detecting changes in capacitance of the device's case (housing) and determining when the device is, or is not, in contact with a user and/or for determining the approximate distance the device is from a user), a free-fall detection circuit for detecting when the equipment is falling, an impact absorbing system, and a means of extending the impact absorbing system upon detection of a predetermined set of free-fall and capacitance conditions.

k) To provide an impact protection system for a portable device comprising a capacitive sensor circuit (for detecting changes in capacitance of the device's case (housing) and determining when the device is, or is not, in contact with a user and/or for determining the approximate distance the device is from a user), a velocity detection circuit for determining the approximate instantaneous velocity of the device, an impact absorbing system, and a means of extending the impact absorbing system upon detection of a predetermined set of capacitance and velocity conditions.

l) To provide an impact protection system for a portable device comprising a capacitive sensor circuit (for detecting changes in capacitance of the device's case (housing) and determining when the device is, or is not, in contact with a user and/or for determining the approximate distance the device is from a user), a velocity detection circuit for determining the approximate instantaneous velocity of the device, a free-fall detection circuit for detecting when the device is falling (low inertial acceleration), an impact absorbing system, an impact absorbing system, and a means of extending the impact absorbing system upon detection of a predetermined set of capacitance, velocity and free-fall conditions.

m) To provide an impact protection system for a portable device comprising a capacitive sensor circuit (for detecting changes in capacitance of the device's case (housing) and determining when the device is, or is not, in contact with a user and/or for determining the approximate distance the device is from a user), a free-fall detection circuit for detecting when the device is falling (low inertial acceleration), a means for detecting the change in acceleration of the device in its inertial frame of reference (may be provide by the same circuit that provides free-fall detection), an deploy able impact absorbing system, an impact absorbing system, and a means of extending the impact absorbing system upon detection of a predetermined set conditions for capacitance, acceleration, and/or changes in acceleration.

n) To provide an impact protection system for a portable device comprising a capacitive sensor circuit (for detecting changes in capacitance of the device's case (housing) and determining when the device is, or is not, in contact with a user and/or for determining the approximate distance the device is from a user), a velocity detection circuit for determining the approximate instantaneous velocity of the device, a free-fall detection circuit for detecting when the device is falling (low inertial acceleration), a means for detecting the change in acceleration of the device in its inertial frame of reference (may be provide by the same circuit that provides free-fall detection), an impact absorbing system, an impact absorbing system, and a means of extending the impact absorbing system upon detection of a predetermined set conditions for capacitance, velocity, acceleration, and/or changes in acceleration.

o) To provide an impact protection system for any of the above mentioned impact protection systems, comprising, an additional override activation of any of the above systems when the velocity of the device is determined to be above a predetermined maximum value and/or when the device is determined to have been in free-fall for a predetermined maximum period of time.

p) To provide an impact protection system for any of the above mentioned impact protection systems, further including a means of detecting the closing velocity of the device with objects immediately around it, and forcing activation of the impact protection system when closing velocities and distances from the closing object are above a predetermined threshold or threshold(s).

q) To provide an energy efficient free-fall detection device comprising an energy efficient motion activation switch designed to provides power to a more energy intensive free-fall detection circuit only after detecting movement of the device. A delay circuit associated with the energy efficient switch maintains power to the energy intensive free-fall detection circuit for a predetermined time after motion is detected. In this way the device automatically engages the free-fall detection circuit protection system when being handled so that it can activate when predetermined free-fall conditions occurs.

r) To provide an energy efficient impact protection device comprising an energy efficient motion activation switch that provides power to a more energy intensive free-fall detection circuit after detecting movement of the device. A delay circuit maintains power to the energy intensive circuit for a predetermined time after motion is detected. In this way the device automatically engages the free-fall detection circuit protection system when being handled so that it can detect when free-fall occurs.

r) To provide an impact protection device comprising, an acceleration switch with an switching acceleration substantially less than the acceleration of Earth's gravity, whereby the acceleration switch provides sufficient inertial acceleration information to determine if the impact protection system is in free-fall condition.

DRAWING FIGURES

FIG. 1 Perspective view of a PDA with an active impact protection system being dropped.

Figure 1A:
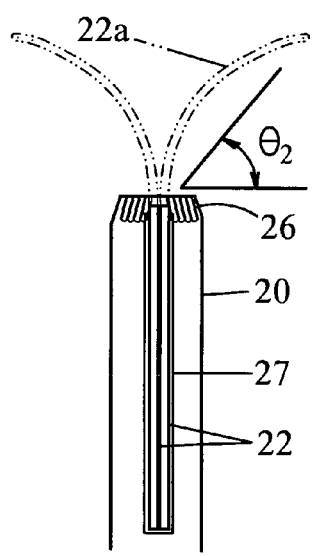

FIG. 1A Side view of PDA in FIG. 1 and shadow view of extended arms.

Figure 1B:
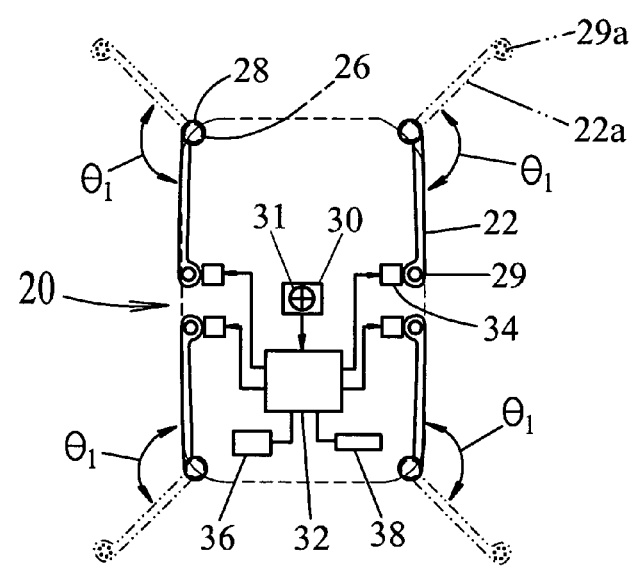

FIG. 1B Example of active impact protection system within the PDA in FIG. 1.

Figure 2:
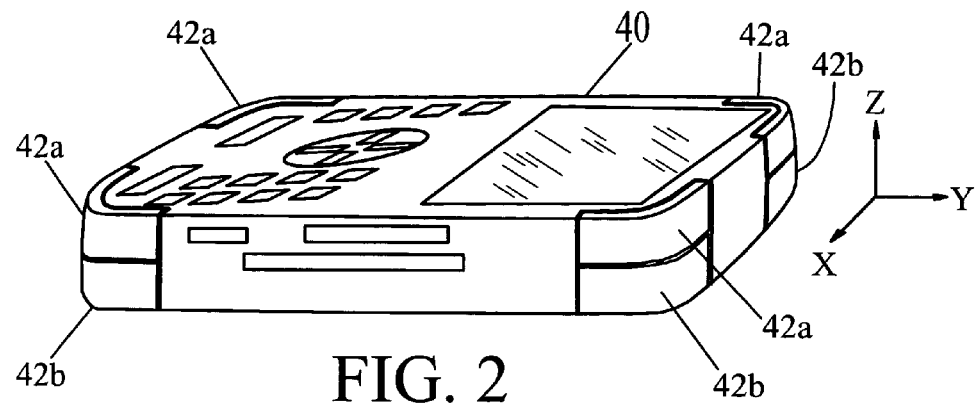

FIG. 2 Perspective view of a PDA with an alternative impact protection system (impact absorbing arms retracted).

Figure 2A:
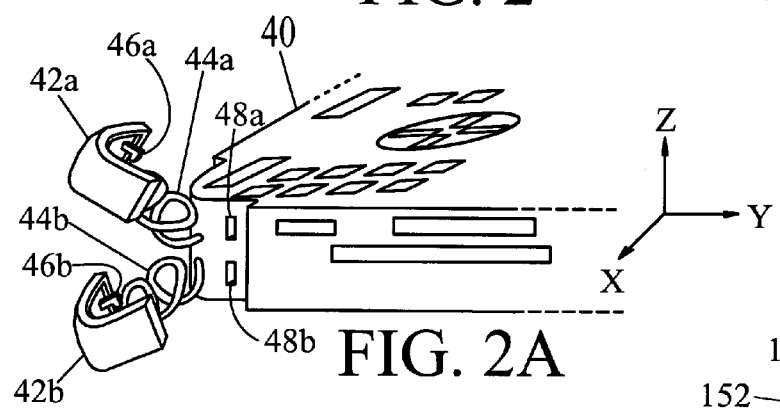

FIG. 2A Perspective-side view of the PDA in FIG. 2 with impact absorbing arms extended for impact.

Figure 2B:
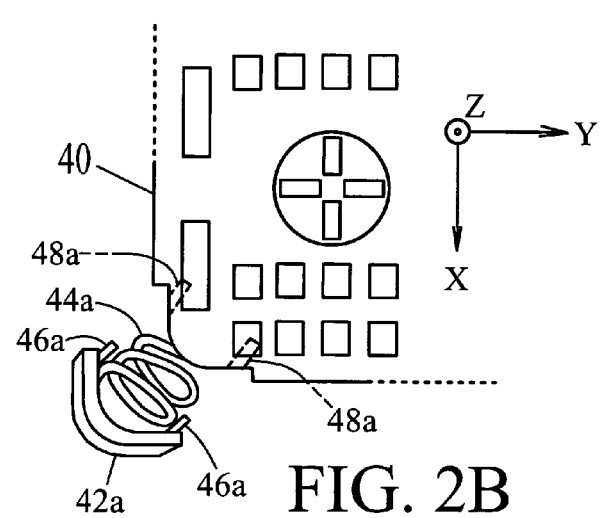

FIG. 2B Top view of the PDA in FIG. 2 with impact absorbing arms extended (only top arm shown).

Figure 2C:
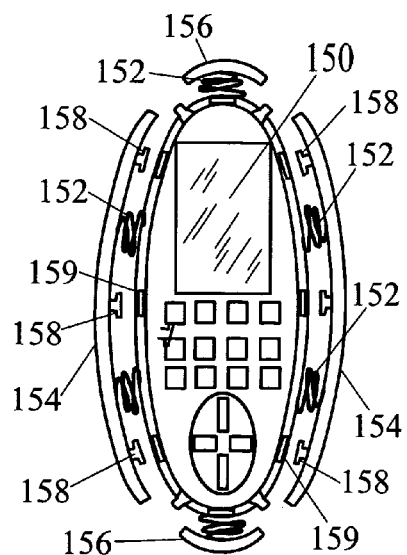

FIG. 2C Front view of a cell phone with side mounted extension system with the impact absorbing arms extended (only top arm shown) from the sides of the cellular phone.

Figure 3A:
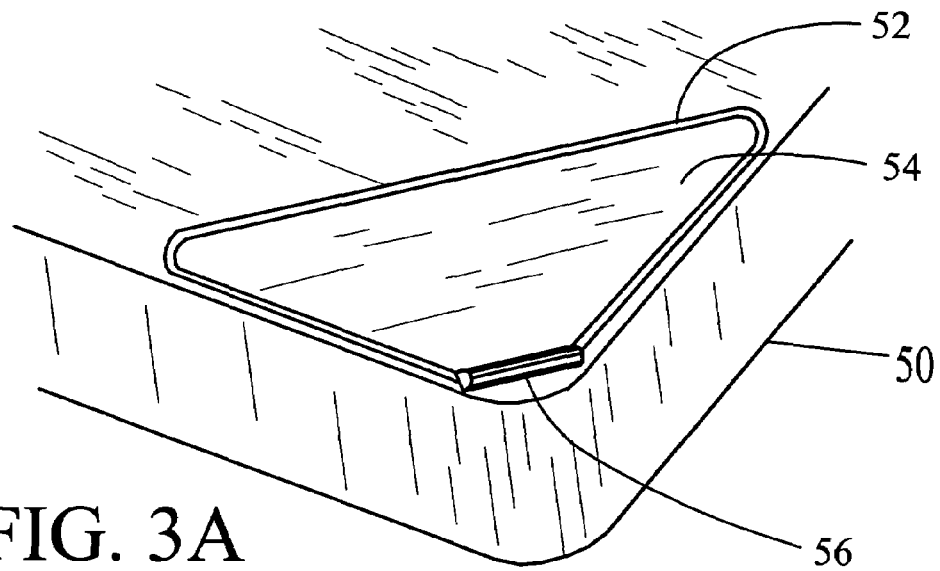

FIG. 3A Perspective view of laptop computer corner with an impact protection system (arms retracted).

Figure 3B:
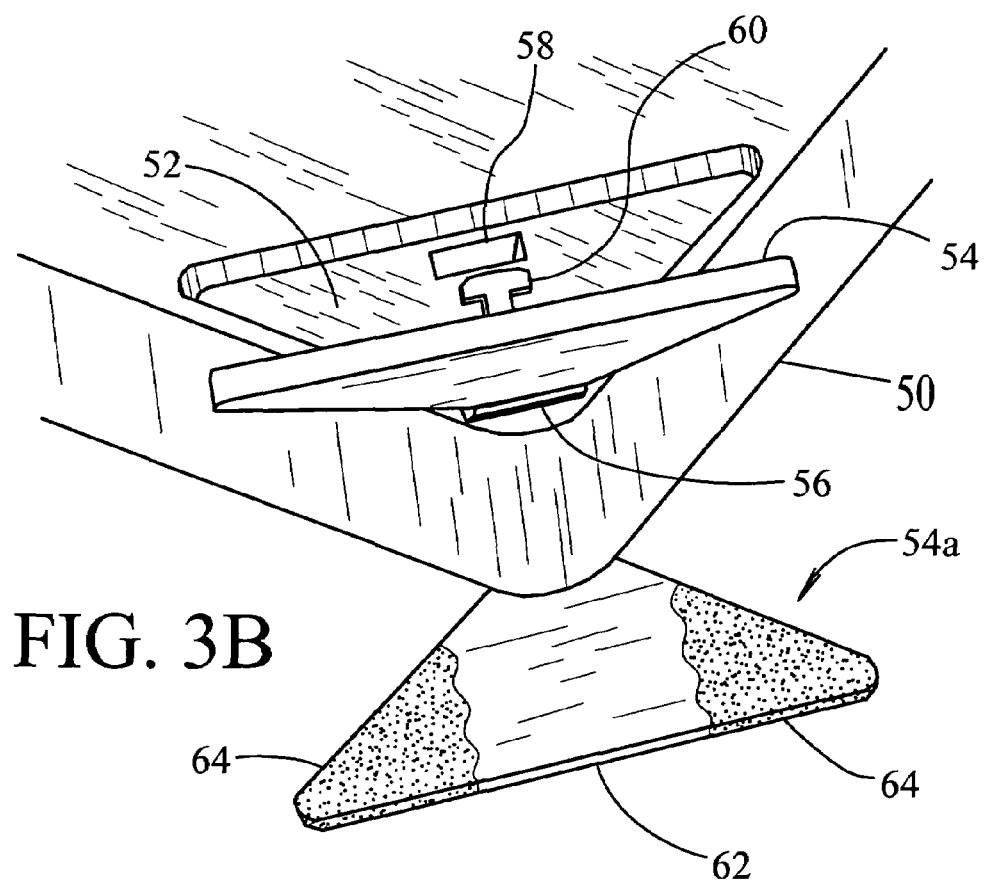

FIG. 3B Perspective view of laptop computer corner with an impact protection system (arms extended).

Figure 4:
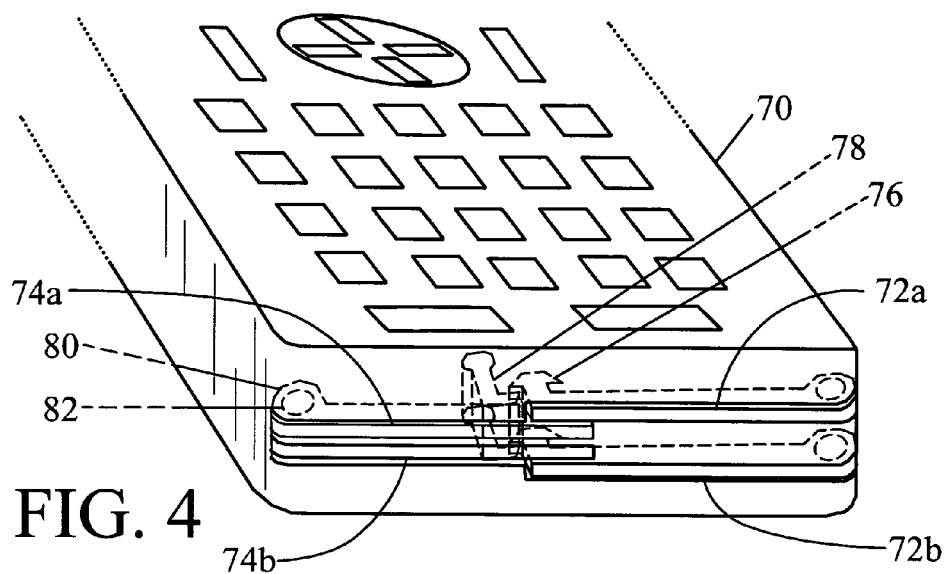

FIG. 4 Perspective view of cellular phone with impact protection arms in retracted position.

Figure 5A:
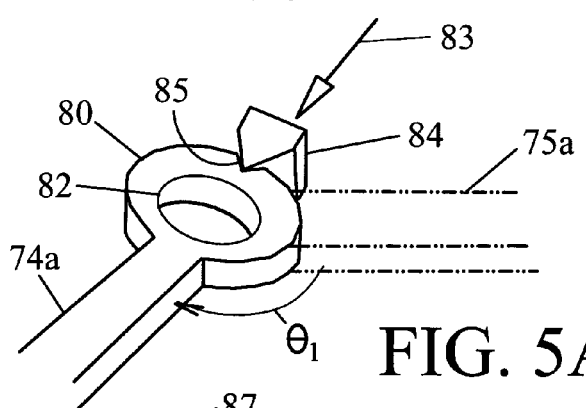

FIG. 5A Perspective view of locking mechanism for impact protection arms.

Figure 5B:
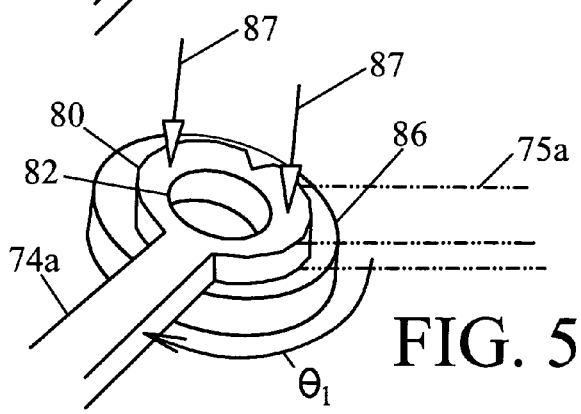

FIG. 5B Perspective view with friction pad dampening for impact protection arms.

Figure 6A:
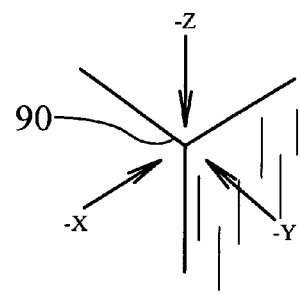

FIG. 6A Force diagram for a three-surface corner.

Figure 6B:
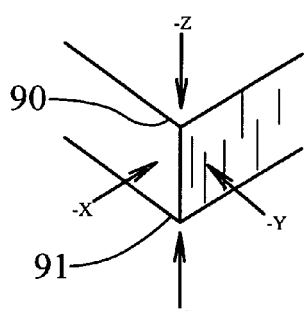

FIG. 6B Force diagram for a pair of three-surface corners (4-surface corner).

Figure 7:
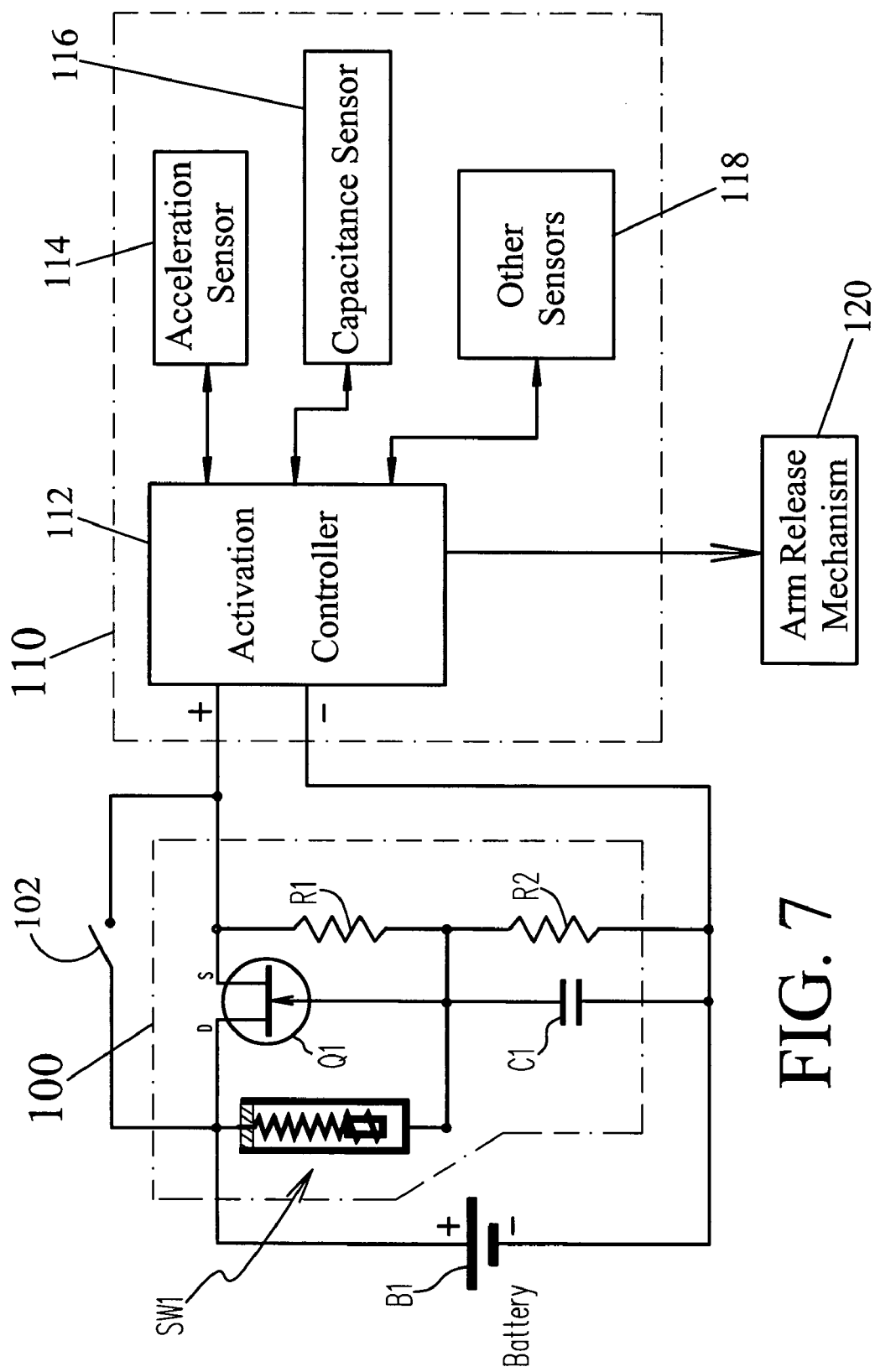

FIG. 7 Circuit/Logic diagram of an impact protection system.

Figure 8A:
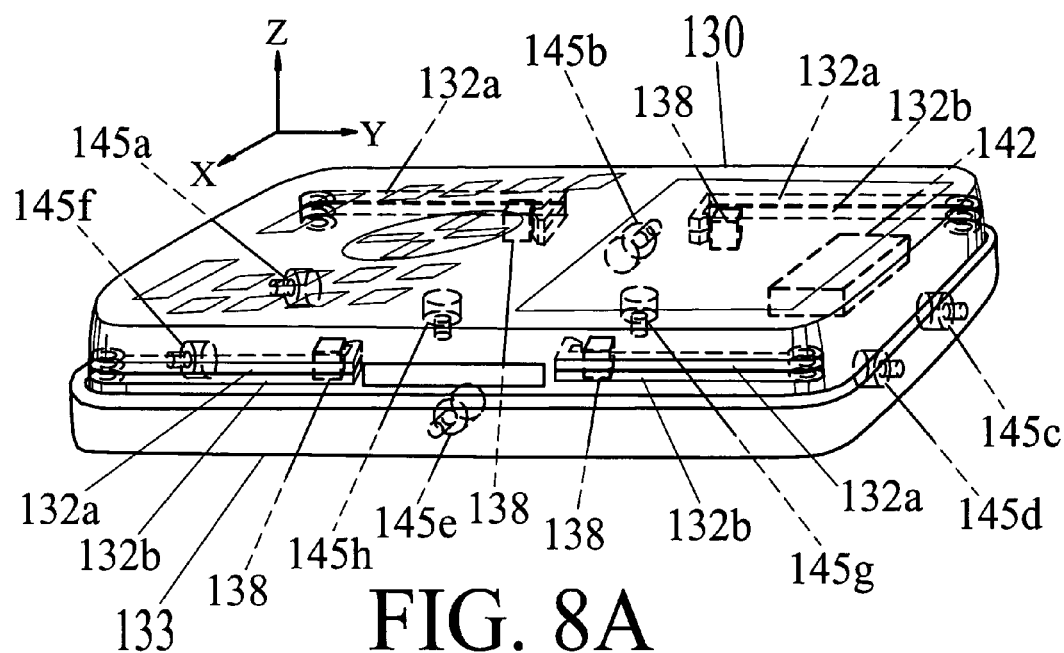

FIG. 8A Perspective view of a fifth embodiment of the impact protection system using pressure switches to determine when a free-fall condition exists.

Figure 8B:
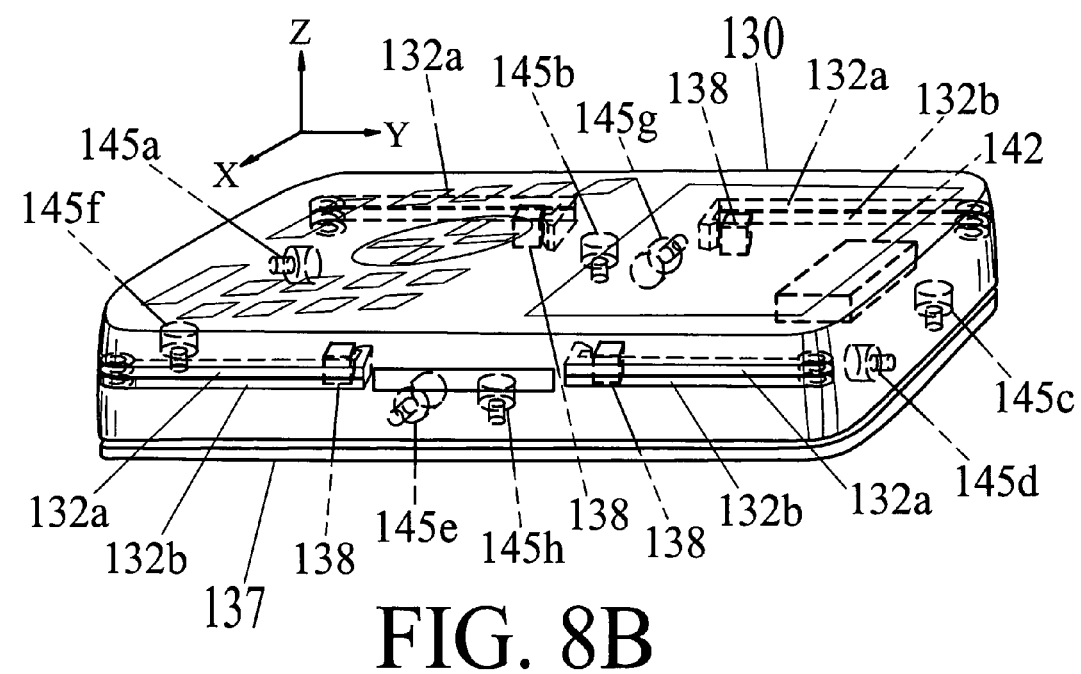

FIG. 8B Perspective view of a sixth embodiment of the impact protection system using pressure switches to determine when a free-fall condition exists.

Figure 8C:
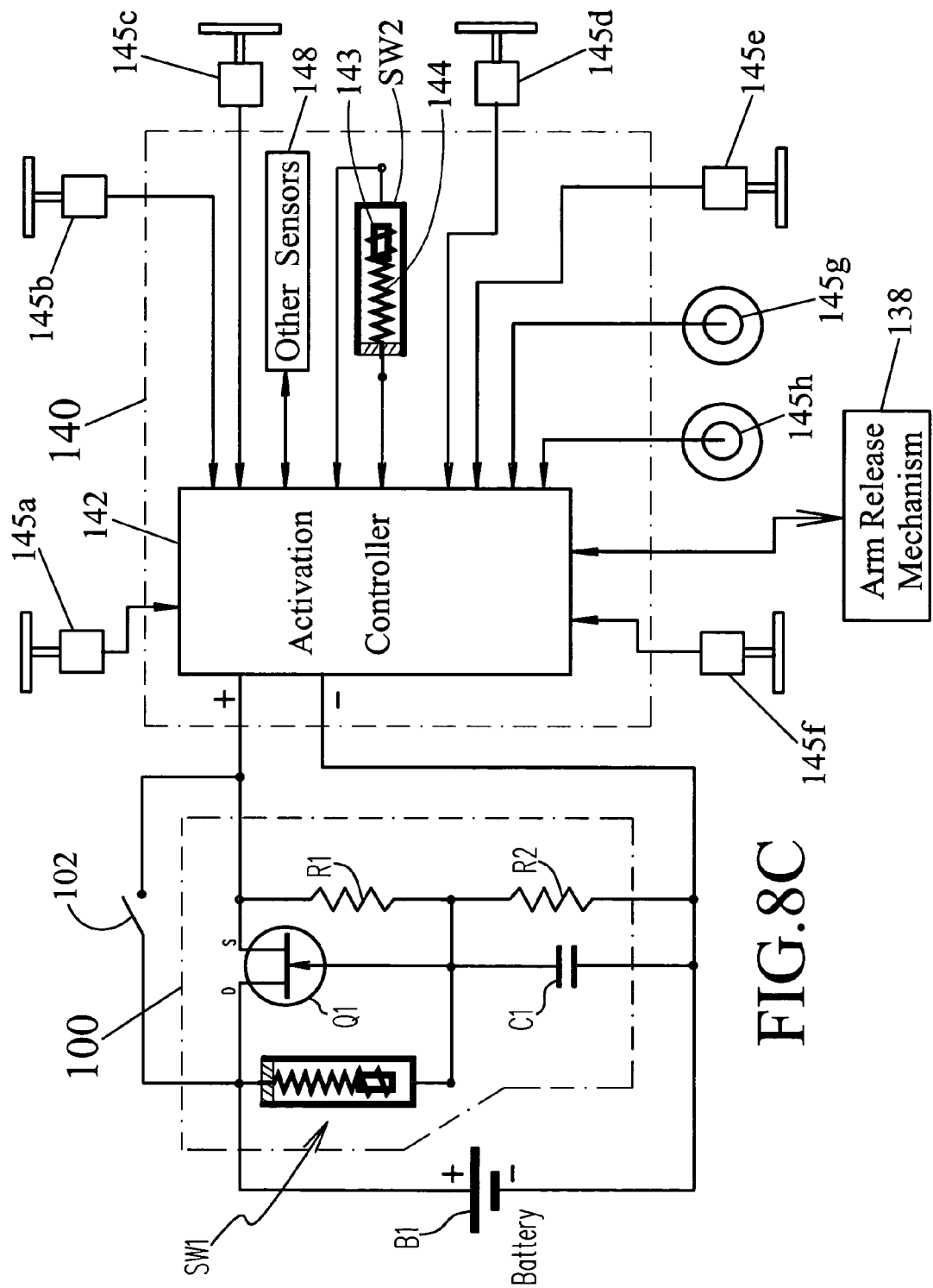

FIG. 8C Circuit/Logic diagram for the impact protection system in FIGS. 8A–B.

DETAILED DESCRIPTION OF THE INVENTION

The basic concept for reducing impact forces on a free-falling device is to reduce the peak deceleration rate of the impact. On impact, forces build up to a maximum peak force and acceleration, and then quickly drop off as the object rebounds. The peak force and acceleration are what cause the damage. If the peak forces are reduce, the likelihood of damage is reduced. This is why people wear helmets when they ride a motorcycle: to provide that added inch of deceleration so that the peak acceleration and force on their head, in an impact, is greatly reduced, and also keep from cracking their head open. Likewise, this is the goal of the disclosed impact protection system, to significantly increase the distance over which the device is decelerated on impact, so that impact forces are greatly reduced.

Physics

For a hard cased PDA, the stopping distance on impact with a concrete floor may be only a couple millimeters, as the plastic or metal, bends and cracks. If thick rubber bumpers are placed on the corners, this stopping distance may be increased to five or more millimeters. Since force equals mass times acceleration (F=ma), the greater the acceleration on the portable device the greater the force. Thus, we want to manage the maximum acceleration, which will control the peak force. Calculating the maximum acceleration for complex impacts is beyond the scope of this paper, so average accelerations will be used with the assumption that if the average deceleration rate is decreased so will the peak deceleration decreased.

The distance needed to stop the device (D) is equal to the impact velocity (V) of the device squared divided by two times the average acceleration (a):

$$D = V^2/2a \qquad \text{Eq. 1}$$

Where,
D=impact distance
V=impact velocity
a=average acceleration

If the impact distance (stopping distance) is held constant, then the needed acceleration increases as the square of the impact velocity. Thus, doubling the impact velocity (V) will increase the average acceleration four times. If we consider a falling object we find that its velocity squared ($V^2$) term is equal to two times the distance dropped (d) times gravitational acceleration (g).

$$V^2 = 2dg \qquad \text{Eq. 2}$$

Where,
d=distance dropped
g=9.8 m/s$^2$
Substituting Eq. 2 into Eq. 1 we get:

$$D = dg/a \qquad \text{Eq. 3}$$

This is good news, since Eq. 3 shows that the needed average acceleration (a), only increases linearly with the distance the device is dropped. Thus, dropping a PDA from twice the height will only double the average stopping acceleration, and in theory only double the peak acceleration and peak force. For our PDA example then, increasing the stopping distance from say one millimeter to five millimeters, increases the safe dropping height by approximately five times. Unfortunately, five millimeters on each side of a PDA corner (one centimeter of cushioning plus the thickness of the PDA) would make the PDA very bulky. To solve this problem, the disclosed impact protection system uses extendible arms that greatly increase the distance (D) over which the PDA is de-accelerated (see FIG. 1) while keeping the overall dimensions the same during normal use. Since the arms only extend when dropped, they can be quite long and provide a large amount of energy absorption over a large distance, without interfering with the operation of the PDA when retracted. Arms having lengths on the same scale as the PDA itself are possible. The arms should be designed to provide sufficient resiliency to stop the PDA when dropped from a predetermined maximum height, without the body of the PDA striking the impact surface. Above this predetermined maximum height, the impact forces may overcome the extended arms and the outer case of the PDA could strike the impact surface (floor, etc.)—though with much less force than if the arms where not there.

In FIGS. 1 through 1B we see a personal digital assistant (PDA) equipped with the disclosed impact protection system. The impact protection system, in this design, comprises a set of eight extendible arms 22 (which act as an impact absorbing means), a spring loading system 26 for each arm, an electrically released latching system 34 for the arms, an acceleration sensor 30, an activation controller 32, a capacitance detector 36, and an acceleration switch 38. Body portion of each resilient arm 22 is pre-stressed so that once released from storage slot 27 they bend to provide impact absorption perpendicular to the front and back face of PDA 20 (see FIG. 1A). Looking at FIG. 1B, we see acceleration sensor 30 is located very near the center of gravity 31 of PDA 20. This is done to reduce sensing of forces resulting from the rotation of PDA 20 when it is in free-fall. Offsetting acceleration sensors can also be used, so that the sensors cancel each others sensing of rotation forces (centripetal forces). Outputs from acceleration sensor 30 is received by activation controller 32, which contains circuitry needed to process acceleration information, and activate latching systems 34 when the proper conditions are detected (see the section titled "Activation Modes" for more details). Additional sensors can also be used, such as, capacitance detector 36, which is designed to measure the capacitance of the outer housing of PDA 20. With the free space capacitance (not touching anything) of PDA 20 known, controller 32 can detect when the device is not in contact with any conductive objects (i.e. not in the hand of a user, but in free-fall, or in contact with non-conductor with a dielectric constant similar to air). A person however, being very conductive, significantly effects the capacitance of the outer case when they touch it, or is even moves their hand close to it. This capacitance information can be used by controller 32 to make better decisions as to when the PDA is in danger of a dangerous free-fall impact.

When predetermine conditions are reached, controller 32 activates latching system 34 to release arms 22 so that they extend outward and away from the body of the PDA as is shown in FIGS. 1, 1A, and 1B. For this particular design, activation occurs when the acceleration sensor detects very-low (near zero) inertial acceleration for 0.25 seconds or longer. The 0.25 seconds corresponds to approximately a one-foot drop from a stationary position. This is one of the simplest activation condition scenarios for controller 32, and more complex activation conditions will be discussed later. Activation delays of much less than 0.25 seconds are possible, which would reduce the distance the device could drop before the impact protection system is activated.

Activation controller 32 is electrically wired to electrically controlled mechanical latching systems 34, which engage arm catches 29 on the end of each arm 22. Each arm 22 is attached to PDA 20 near its corners with a spring loaded pivot hinge 26. The spring loading provides the force for extending arms 22 after release to position D1 shown in FIGS. 1, to their extended position seen in position D2 and D3, and as arms 22a in shadow in FIGS. 1A and 1B. The arms in this example extend approximately to an angle $\theta_1=135$ degrees with respect to both the side-edges and front-face of PDA 20. This orients each arm to about 135 degrees away from the plane of the three surfaces it is protecting (see FIG. 6A for example of three directions impact forces can come from at a rectangular 3-edge corner). In this way, a single impact arm can protect one 3-edge corner (or 3-surface corner) and absorb energy perpendicular to the three surfaces forming that corner. Thus, substantially independent of the direction PDA 20 falls on that corner, the impact arm will strike the impact surface 24 first and absorb energy before the main housing of PDA 20 can strike surface 24 (impact of housing would only occur if great enough impact velocity occurred to overcome the energy absorbing ability of arms 22. Arms 22 can be made stiffer and/or made longer to provide increased energy absorption to handle nearly any impact energies the device may need protection from. Friction pads (see FIG. 5B) in contact with the arm hinges provide dampening of impact energy in the directions of rotation of the hinge. Additional dampening can also be added to dampen the actual bending of the body portion of arms 22, by integrating a resilient energy dissipating material on the arms. After activation, and absorbing the impact, the arms can be pushed back into their storage slot 27 to prepare it for another accidental drop. Latching mechanisms 34 are designed to grip arm catches 29 as they are pushed back into place.

In FIG. 1B, acceleration switch 38 has been added to provide very low power usage when PDA 20 is not being used and is not in great danger of being dropped. Switch 38 can be a very sensitive mechanical acceleration switch, which is normally open until acceleration forces cause a weight within the switch to move and make contact with a conductor, and completing the circuit. This closed circuit condition does not last long because of movement of the acceleration switches weight, but while it is conductive it powers up a delay circuit which provides power to the acceleration sensor 30, controller 32, capacitance sensor 34 and any other circuitry needed for detecting a dangerous free-fall condition. Energy is saved because when the device is not being used (stationary) acceleration switch 38 is not conductive and only a very tiny trickle current is flowing through the delay circuit while it is inactive.

In FIGS. 2 through 2B we see a PDA 40 with an alternative impact protection system design, comprising corner bumpers 42a–b that extend to form impact arms that can absorb impact energy directed at that corner, springs 44a–b, arm catches 46a–b, and latching mechanisms 48a–b. Corner ends 42a and 42b form the upper and lower corner bumpers of PDA 40, respectfully. Springs 44a and 44b provide the extending force to extend ends 42a and 42b to their extended positions, and also to provide impact absorption of forces directed at the its respective corner (see FIGS. 2A and 2B). Springs 44a and 44b are representations of the resilient type of system that may be used, and are shown here as a simple coil spring. An actual system could have an optimized spring configuration that could provide good energy absorption in all of the x, y, and z-axis directions, not just in the direction of extension of springs 44a–b. The arrangement of springs for energy absorption is a well known science, and each device can easily be optimized to fined tuned its energy absorbing characteristics according to its size, weight, and shape.

The corner shown in FIGS. 2A and 2B is the bottom right corner of the PDA in FIG. 2. The coordinate system shown with each drawing is oriented the same with respect to PDA 40. Using this (X,Y,Z) coordinate system we can see that end corner 42a extends outward in the general direction of (1, −1,1) and corner 42b in the direction (1,−1,−1) which are both angled about 45 degrees from the X, Y, and Z-axis. These directions are essentially the same as for arms 22 in FIGS. 1, 1A and 1B. This is because it places the impact end of the arm in such a position that the impact absorption distance is approximately the same for each extreme impact angles (i.e. impact force along the X, Y, and/or Z-axis). Each corner bumper has a pair of arm catches; two catches 46a on upper bumper 42a, and two catches 46b on lower bumper 42b (not all catches shown). Catches 46a–b are designed to secure bumpers 42a–b to the housing of PDA 40 by interaction with latching mechanisms 48a–b, respectfully. Placement of catches 46a and latching mechanisms 48a are more easily seen in FIG. 2B. Catches 46b and latch 48b are not shown in FIG. 2B to provide a more clear drawing. When mechanisms 48a–b are engaging catches 46a–b, springs 44a–b are respectfully compressed between bumpers 42a–b and the housing of PDA 40. Note that more space can be provided for an advanced spring system housed within the corners than is shown here. Also the use of flat, or wave springs can greatly reduce the volume occupied by the springs. Also note, that both designs presented so far can easily absorb rotational energy and momentum of the PDA. While some designs are better at absorbing rotational energy and momentum than others, rotational energy is usually small compared to the linear energy and momentum of a falling portable device.

In FIG. 2C we see a cellular phone 150 with side-mounted extendable arms 154 and 156, extended to protect the phone from impact damage. Arms 154 and 156 are connected to cellular phone 150 by springs 152, and provide resilient support for the arms, and also a means of forcefully extending the arms when the impact protection system (see FIGS. 7 and 8C) installed on this phone detects a dangerous free-fall condition. Latches mounted in recesses 159 on phone 150, engage connector ends 158 to hold arms 154 and 156 in their retracted position (against sides of phone 150). Activation of the impact protection system releases connectors 158 and the arms extend by themselves to the positions shown in FIG. 2C. Note that only the top four arm sections are seen, and a second set of four arms below them are not shown to preserve the clarity of the drawing. Extendable arms 154 and 156 would extend into and out-of the paper much like arms 42a and 42b extend outward with a Z-axis component in FIGS. 2A and 2B. Many different choices exist for springs 152, including waves-springs, coiled springs (as shown), leaf springs, and many other possible custom shapes. Springs 152 should be stiff enough to absorb a reasonable drop distance without arms 154 and 156 contacting the outside of the body of phone 150. Optional latching systems may provide latching at the ends of arms 154 and 156 so that connectors 158 do not need to protrude from the interior surface of the arm.

In FIGS. 3A and 3B, we see another alternative design for providing extendible impact arms 54 and 54a. In this design, arms 54 and 54a are stored on the front and back face of laptop computer 50, respectfully, instead of along the narrow edge as seen in FIGS. 1 through 2B. This particular configuration is not necessarily a better design for laptop computer, it just happens to be the type of portable device I chose for this example. A laptop computer could just as easily employ any of the protection systems discussed in this patent and many other designs. The activation and control circuitry for arms 54 and 54*a* can be the same as any of the activation systems discussed in this patent or use a modified controller circuits that more perfectly detects when the device is actually in a device endangering fall (see Modes of Activation). The arm design comprises arms 54 and 54*a*, each with a spring-loaded hinge 56, a storage indentation 52, a catch, and an electronically controlled latching mechanism. Arm 54*a* is constructed differently than arm 54 to show an additional example, which includes resilient energy absorbing ends 64 attached to a harder center 62. Ends 64 can be made of a soft neoprene polymer that bends on impact and would significantly reduce the stresses placed on hinges 56 for impacts from the sides of arm 54*a*. Arm 54 is just a single piece design and could be made of a high-impact plastic. Note that the shape of arms 54 and 54*a* can be much different than shown to provide impact the characteristics that are desired. For example, flexible fingers can be added to the outer edge of the arms to provide greater impact energy absorption directly along the plane of the arm's face and toward hinge 56.

In FIG. 4, we see a cellular phone 70 with an impact protection system, comprising a housing 70 arms 72*a–b* and 74*a–b*, a latching mechanism 78 and an activation control circuit (not shown). In this design, arms 72*a–b* and 74*a–b* extend so that they overlap at the ends when retracted. Each arm comprises a hinge section 80 with a hinge support hole 82 on one end and a arm catch on the other. Hinge section 80 is supported by the housing of phone 70, which provides a stable pivot axis for the arms to rotate around. Each arm is spring loaded in any of the many ways that are possible, including pairing up arms on each corner (i.e. 72*a–b* or 74*a–b*) and using a single bias spring (not shown) to provide the force needed to extend the arms when released. Catch 76 on the end of each arm is designed to be engaged by latching mechanism 78. Mechanism 78 is only partially drawn in FIG. 4 with only the latch member showing. Latching and locking mechanisms are well known and should not need further explanation here. Having the arm catches 76 on all four arms (72*a–b* and 74*a–b*) aligned as shown, allows a single latch arm 78 to be able to hold and release all the arms. Latch hook 78 can be actuated by a single actuating solenoid (not shown), which in turn would release all four arms (72*a–b* and 74*a–b*). A second set of arms (not shown) similar to (72*a–b* and 74*a–b*) are be installed on the other end of cellular phone 70. When extended, all eight arms can take a position similar to arms 22 in their extended positions in FIGS. 1 through 1B to provide full 360-degree impact protection coverage for the phone with only two solenoids. Note that the in FIG. 1B four separate actuators are needed. Further reduction in actuators could be achieved, where a single solenoid would release both sets of arms through a simple mechanical linkage (not shown).

In FIGS. 5A and 5B, we see two examples of how arms 74*a–b* can be controlled to provide secure locking and dampening when the arms are extended for impact. During impact, large forces are exerted on the arm joints, specifically hinge 80 and its support structure (not shown). Spring tension on arm 74 may not be sufficient to resist an impact that pushes the arm in the direction of its hinge axis. A heavier spring would solve this problem, but then it becomes more difficult for the user to push the arm back into its retracted position. Thus, an energy absorbing system of some kind may be beneficial.

FIG. 5A shows hinge 80 arm 74*a* with a locking mechanism 84, which is biased in the direction of arrow 83. Arm 74*a* is shown in its extended position, retracted position 75*a* for the arm is shown in broken lines. Mechanism 84 snaps into slot 85 when the arm is rotated to its extended position (as shown). The interaction between 84 and 85 can locked the two together until the user releases them, or a soft locking connection where sufficient force exerted on arm 74*a* causes notch 85 to slip past mechanism 84. Mechanism 84 can also be designed to create friction against hinge 80 as the arm rotates, further absorbing energy. Mechanism 84 can also be spring loaded and dampened, so that when locked into hinge notch 85, dampening systems within mechanism 84 provide the needed biasing force for impact energy absorption.

FIG. 5B shows hinge 80 with a friction plate 86 for providing energy absorption during impact. Many types of friction plate materials, shapes, and designs can be used. In FIG. 5B a simple friction disk 86 is shown in contact with the surface of hinge plate 80. Friction biasing force 87 may come from a spring, or other biasing device, and provides a somewhat constant friction force to resist rotation of arm 74*a* around its pivot axis. Thus, the hinge spring biasing(not shown) on arm 74*a* can be less than if no friction plate were used, because part of the impact force can be absorbed by the friction surface. Thus, the hinge spring bias does not have to absorb it entirely by itself. However, the spring biasing for extending arm 74*a* still needs to be great enough that the arm will extend to its proper position. The arm's hinge spring bias can be designed so that momentum of the extending arm causes it to slide to a stop near its optimum position for impact absorption. Many other alternative means exist for absorbing impact energy and stopping the arm in the proper position. The use of rubber stops, and other dampening systems can also be used. Alternatively, friction biasing force 87 can be designed to increase on impact, or after the arms are deployed (extended) to provide greater energy absorption by friction plate 86. This would allow smaller hinge springs on the arms because of the reduced friction they must overcome to extend the arms.

In FIGS. 6A and 6B, we see a force diagram showing the directions that impact forces may come at a three-surface corner and a four-surface corner respectfully. In FIG. 6A we see a three-surface corner 90 (also three-edge corner) of a portable electronic device. The three impact force directions (−X, −Y, −Z) are shown in FIG. 6A, and are perpendicular to its respective surface that would receive that impact force. The corner must be protected from each of these force directions to properly protect the device. The directions which impact forces can come at corner 90 are inscribed by a tetrahedral shaped pyramid with vertices defined by impact force arrows −X, −Y, and −Z. Impact force directions outside this pyramid have difficulty actually impacting the corner because other corners of the portable device will strike the impact surface first (assuming a flat impact surface). Thus, impact force direction will generally not be passed the perpendicular of the surfaces being impacted. In FIG. 6B we see an expanded view of corner 90 with a second corner 91 near by. In this situation the two corners form a four-surface corner (four-edge corner). The addition of this second corner 91 changes the directions impact forces may come from, and now forces form the +Z direction may also impact the corners. These four force directions (−X, −Y, −Z, and +Z) must be protected by the arm arrangement for that corner. With properly designed arms, it is possible for a single arm to protect corners 90 and 91, but would require an arm that is elongated in the −Z and +Z directions to protect the top and bottom surfaces.

Many other ways exist for extending impact absorbing arms and the above designs should be considered examples of the disclosed invention. For example, the arms can extend in a number of other ways, including linear extension (i.e. out of a spring loaded holes much like a snake coming out of a tunnel) and others. For a linear extension system the arms would be spring loaded to come out of the hole when released. The arms can include a slight pre-stressed bend to them like arms 22 shown in FIGS. 1, 1A and 1B. This bend allows the arms to provide a three-dimensional impact protection even though the arms extend from a substantially planar array of holes. Sixteen arms can be used (four for each corner) to assure impact absorption from every angle.

The circuit in FIG. 7 is a one example of how an impact protection system could be wired, with the components in box 100 representing one possibility for a "wake-up motion sensor", and the components in box 110 and Arm Release Mechanism 120, one possibility for a free-fall protection/detection system. Many other circuit configurations exist, but example was used because of its very low standby current (about 0.1 μA—(micro amperes)). This current drain so small that even after years of standby power there would not be a substantial power drain.

Bi 3 v lithium battery
SW1 Acceleration switch (1.02 g switch)
Q1 N-channel JFET-NTE458 (low voltage)
C1 1–10 μF for a delay of 15 to 150 seconds, respectfully
R1 1/16 W 50 MΩ (50 Millions Ohms, 50 Mohms)
R2 1/16 W 20 MΩ (also works well with R1=20 MΩ, when R2=10 MΩ, but C1 must be twice as larger to create the same delay)

JFET Q1 passes current whenever acceleration switch SW1 is closed. By using JFETs, instead of Bipolar transistors the series voltage drop across motion sensor 100 is very small, thus allowing battery Bi to be low-voltage. The JFET also provide very high resistance when in its "off" state. The circuit in FIG. 5 draws approximately 0.1 microamperes (0.1 μA) when acceleration switch SW1 is open. This translates into a 240-year standby battery drain time for a 2032 button battery. This is much longer than its storage life. Switch 102 represents the power switch to the portable device. Thus, when the device is turned "ON" the free-fall detector system is also "ON". Switch 102 may also have a delayed turn-off on it if desired to conserve power when the unit is forgotten and left "ON".

The acceleration sensor circuit 100 comprises acceleration switch SW1, N-channel Junction Field Effect Transistor (JFET) Q1, delay timing capacitor C1, bias resistor R1 and delay timing resistor R2. When acceleration switch SW1 detect sufficient acceleration it conducts current (closed circuit) from the positive terminal of battery B1 to the gate of JFET Q1. Acceleration switch SW1 is made very sensitive so that nearly any motion of the device in which it is installed will cause it to sporadically close the circuit. A change in static acceleration of only five percent or less should provide sufficient sensitivity to detect most normal handling. The sensitivity of switch SW1 can be increased of decreased depending on the design (i.e. laptops would probably require a more sensitive acceleration switch than a PDA since it is more massive and more difficult to accelerate fast). Note that when the device is being used, free-fall detection system 110 can be powered up independently of switch SW1. Thus, the protection system can be powered whenever the device was in use. Switch motion sensor circuit 100 would only be useful for times when the device was accidentally bumped off a table while not in use. When acceleration switch SW1 is bumped enough that it closes, capacitor C1 is quickly charged, which raises the gate voltage on JFET Q1 and effectively opens the gate so current flows freely through JFET Q1 and into free-fall detection system 100. After acceleration switch SW1 no longer senses acceleration (open circuit) the voltage on capacitor C1 keeps JFET Q1 conducting. As charge drains from capacitor C1 through resistor R2 and to a lesser extent through resistor R1, the voltage on the gate of JFET Q1 begins drop, which eventually closes the gate and cuts-off current flow. A very small amount of current continues to flow through JFET Q1 even after capacitor C1 is drained to keep resistors R1 and R2 biased. This small current must continue flowing to keep JFET Q1 biased closed. R1 should be approximately three times greater than R2 to make sure Q1 is completely off, and that a current of only 0.1 μA leaks through Q1.

The very high impedance of the gate on JFET Q1 allows resistors R1 and R2 to be very large and, thus, the delay circuit to use a small value for capacitor C1. Capacitor C1 and Resistor R2, form an RC delay timer which delays the closing of JFET Q1 long after switch SW1 has stopped conducting. With resistor R2=50MΩ, resistor R2=20MΩ, and capacitor C1=1 microfarad (μF), the RC time constant is approximately fifteen seconds. Larger time delays can be obtained by increasing the resistance of resistors R1 and R2 or by increasing the capacitance of capacitor C1. Note that other digital timing circuits can be used, but will normally require more standby power that circuit 100, which is given as an example of how low standby power can be for the impact protection system.

Free-fall detection system 110 comprises activation controller 112, acceleration sensor 114, capacitance sensor 116 and other sensors 118 which may include ultrasonic rangefinders, and other sensors that can be used to determine if the protected device is in danger of impact. Acceleration sensor 114 and capacitance sensor 116 are two examples of sensors that might be used to determine if a device is in a dangerous free-fall condition. Sensors 114 and 116 can be used separately or together, or in combination with other sensors to provide information to activation controller 112. Controller 112 is designed to monitor this information and determine when conditions are met that required activation of the impact absorbing arms (released by Arm Release Mechanism 120). Activation controller 112 can comprise digital circuit logic, such as, a microprocessor along with control software. The program would evaluate data coming from the sensors to determine if a pre-selected criterion is met. Activation controller would also include a signal-out line to a latching mechanism 120, which upon receiving a signal from controller 112, would release the impact absorbing arms to their extended position. Many different modes of sensor criteria are possible that can be used together or separately to determine when to activate the arm release mechanism 120. See the "Activation Modes" section of this document for several examples of different ways of determining "dangerous free-fall conditions" are discussed.

In FIG. 7, acceleration switch SW1 can comprise a simple spring and weight within a conductive can. The values of the spring and weight are chosen so that gravity alone is not quite enough force to cause the spring and weight to make electrical contact with the surrounding can, but almost. If switch SW1 is made correctly, only a very small additional acceleration is needed to cause the weight and spring to make contact with the can and complete the circuit. Even accelerations in directions other than gravity will cause the mass to bounce, which may cause it to strike the side of the can and activate motion sensor circuit 100. The system can also use more than one acceleration switch in parallel so that any one of them can activate motion sensor switch 100. Acceleration sensor 114 is a more advanced acceleration detector and can be designed to sense acceleration along all three axis and have gross and/or fine acceleration resolution. In specific modes, the criteria for sensor 114 can be to detect when acceleration from the sensor's frame of reference has dropped to nearly zero. If net acceleration is not zero then the sensor would not have to determine nearly as accurately what none zero value the acceleration is. In other modes, such as for detecting the actual velocity of the portable device, acceleration sensor 114 may need to be very accurate and determine acceleration rates with precision. In order to determine velocity, the acceleration needs to be integrated over time. For such systems, a velocity accuracy of plus or minus ten percent (±10%) should be sufficient since adding ten percent (10%) to the portable device's velocity only increases its impact energy twenty-one percent (21%). Normally, this amount of error would be design into the system's safety margin. Present day integrated accelerometers would work nicely for this purpose. The accelerometers are low power and highly accurate. However, in order to determine velocity, a gyroscope assembly is needed to determine which direction the portable device is acceleration and to also keep track of which direction gravity is coming from. Gyroscopes can now be built onto integrated circuits, and since the system used here only needs an approximate idea of the velocity, a relatively simple and inexpensive IC three-axis gyro could be used. Combining information from the gyros and the accelerometers allows the system to determine instantaneous velocity. Capacitance sensor 116 can give activation controller 112 additional information about its environment should it need it.

Also in FIG. 7, capacitance sensor 116 is connected to the outer case of the portable device it is protecting. The circuit is used to "sense" the capacitance of the outer case. When conductive bodies come near and/or touching the outer case, changes in capacitance can be detected by sensor 116. The capacitance sensor itself may consist of any of a number of known capacitance measuring circuits. However, for most uses with this type of protection system, the capacitance value is only needed when it gets very near its free-space value (when it is in free-fall). All other capacitance values mean the portable device is in contact with something or someone. This test can easily be done with a resonance circuit that reaches peak resonance when the capacitance of the device's housing is at its free-space capacitance. In this case a strong signal can be sent to activation controller 112 to signal that the device is in possible free-fall. Likewise, when the capacitance value for the device housing is not at its free space value, the resonance circuit will be out of resonance and no signal is sent to controller 112. If a leather case is placed around the device, the resonance circuit can be sensitive enough to detect it and deactivate the impact protection system. In most cases such additional protection will be built into the device so that it does not interfere with the deployment of the impact arms.

In FIG. 7 we see that additional sensors 118 can be used to augment or replace information coming from the other sensors. Sensors 118 are shown here to draw attention to the fact that only a small sampling of the sensors, and combinations of sensors, that can be used to sense free-fall conditions for a portable device. For example, sensors 118 could comprise a number of ultrasonic proximity sensors placed around the device being protected. In such a case, sensors 118 can completely replace sensors 114 and 116 with its ability to sense and track object or surface around it. When quickly approaching an impact surface the ultrasonic sensors would detect the surface and calculate its closing speed. If the speed is too great then the impact arms would be extended. If the closing speed is smaller, the arms are not extended. Normally however, an accelerometer will also be used with proximity sensors, since a user reaching quickly for the device could setoff the impact protection system in error. With an accelerometer the activation controller can sense whether the device is actually free-falling or just being reached for.

In FIGS. 8A through 8C, we a fifth embodiment of the disclosed invention. A PDA 130 is constructed with a free-fall detection system comprising extendable arms 132a–b, arm release mechanisms 138, programmable activation controller 142, pressure sensors 145a–h, acceleration sensor SW2 and various wires to connect pressure sensors 145a–h and release mechanisms 138 to controller 142 (see FIG. 8C). The use of acceleration sensor SW2 can replace pressure sensors 145a–h or used together with them. The use of PDA 130 with a pressure sensor based free-fall detection circuit will be discussed separately from free-fall detection circuits that use one or more acceleration switches SW2.

In FIGS. 8A through 8C, one or more pressure sensors can be used to detect the presence of physical contact of PDA 130 and/or exterior housing 133 or 137. The protection system disclosed in FIGS. 8A–C, uses eight pressure sensors 145a through 145h to detect when a solid object is supporting the device and is not in a dangerous free-fall condition. These pressure sensors (or contact sensors, can comprise any number of different sensing units that are commercially available which can detect a mechanical or physical contact between a portable device (i.e. PDA 130 and external housing 133 or 137), and an external solid object. In general, the devices in FIGS. 8A–C requires physical contact with a solid object to not be in a free-fall condition. In other words, mechanical support for either PDA 130 and/or external housing 133 is needed to prevent free-fall. Mechanical contact sensors, here after generally referred to as "pressure sensors", can comprise any number of commercially available sensors, such as, mechanical pressure switches (both normally-open and/or normally-closed), capacitance activated switches, optically activated switches, magnetically activated switches, strain gage sensors, etc. Pressure sensors 145a–h are connected to programmable activation controller 142 by wires or other data transmission means (i.e. wireless connection, fiber optic line, etc.) so that the controller can process information about the pressure sensors' state. Pressure sensors 145a–h mechanically connects PDA 130 to an external housing 133. Additional mechanical support between the housing of PDA 130 and external housing 133 to limit movement with respect to the two housings. External housing 133 has raised sides that cup PDA 130 and can provide a gripping surface on its exterior for the user. In a state of free-fall, spring loading within pressure sensors 145a–h (or other mechanical biasing means) force external housing 133 to its neutral position where all the pressure sensors are deactivated. This spring loading (or biasing) is sufficiently weak that at least one of the pressure sensors is activated when the device in FIGS. 8A–B is being held or resting on a solid object in any orientation. For example, PDA 130 in FIG. 8A, has sufficient weight to activate pressure switches 145g–h when in the position shown. Similarly, external housing 133 in FIG. 8A, has sufficient weight to activate pressure switches 145g–h when PDA 130 is placed face down (inverted from position shown in FIG.

8A) on a surface, or held in that orientation (pressure along Z-axis). Similarly, side pressure switches 145*a–f* are activated when PDA 130 is orientated along each of their respective axis (X and Y-axis). Switches 145*a–h* may also be double activated, where they are biased toward center position and then activate (toggle) when moved in either direction. This allows fewer pressure switches to determine if a supporting pressure exists for PDA device 130. Extendable arms 132*a–b* are similar to arms 22 seen in FIGS. 1 through 1B, and arms 72*a–b* seen in FIGS. 4 through 5B. Arm release mechanisms 138 can comprise a simple solenoid that would be activated by activation controller 142, when the predetermined sensor conditions are detected from pressure switches 145*a–h*.

In order to give the combined structure of PDA 130 and external housing 133 or 137 a solid feel (feel like a single device not two pieces loosely attached, the actuation distance for pressure switches 145*a–h* must be minimized. An actuation distance of less than one millimeter should be sufficient to make the movements between the PDA and external housing nearly imperceptible. Also, pressure switches 145*a–h* can be designed not to produce any audible sound when being toggled, so the user aware of the switching going on. Thus, reducing the distance the external housing must move to toggle the pressure sensors and making the switches silent will give the entire device a more solid feel. Pressure switches 145*a–h* preferably require very little pressure to toggle between states. This allows even small off-axis forces can provide activation of the pressure sensors.

One example, normally-open pressure switches with a very-short activation distance (toggle distance) can be used for pressure sensors 145*a–h*. Mechanical normally-open (open circuit—nonconductive) pressure switches most often fail in their open-circuit state because of dirty contacts or corrosion. This allows a number of mechanical switches to fail without necessarily causing the protection system to activate and release extendable arms 132*a–b*. This is because controller 142 is looking for a state where all the switches are open-circuit, which would normally only occur when the device is in free-fall. With one or more pressure switches failing in the open-circuit state, the disclosed protection system can still function properly with the remaining switches as long as the failed switches leave an orientation for the device that only depresses the failed switches. If this happens the protection system would give a false free-fall signal and deploy extendable arm 132*a–b*. If a normally-closed (closed circuit—conductive) pressure switch is used, and it fails in an open circuit state, the protection system would essentially be deactivated, since it would always have a sensor detecting mechanical pressure (false reading). This can be an advantage since one would not get a false activation signal, which could happen if sufficient normally-open pressure switches are used. If a mechanical pressure switches (pressure switch) any number of activation methods can be use such as capacitance change, optical sensing, etc. Even different types of pressure sensors can be used together if programmable activation controller 142 is programmed to handle the different sensor outputs they provide. Pressure sensors 145*a–h*, may also be of double toggle activation switches, where the switches are normally-open at a center position and then toggles (activates) if moved in either direction (push and pull). Spring biasing within the switch itself can provide then needed restoring force to return the switches to their normally-open state when no pressure is being detected. This double action switch has the advantage of providing physical contact detection from two directions not just one.

In FIG. 8B, we see a second example of pressure sensors 145*a–e* being used to detect when PDA 130 is in contact with a solid object. In this example, external housing 133 is replaced by external housing 137 which comprises the back housing of the PDA. Pressure sensors 145*a–e* are oriented differently than seen in FIG. 8A, and attach PDA 130 to external housing 137. Pressure sensors 145*a* and *d* provide detection of external forces along the Y-axis. Pressure sensors 145*b, c, f* and *h* provide detection of external forces along the Z-axis. And pressure sensors 145*e* and *g* provide detection of external forces along the X-axis. Z-axis sensors 145*b, c, f* and *h* can be different types switches, with some switches activating when pushed and others activated when pushed. Z-axis sensors 145*b, c, f* and *h* could provide activation in both pushed and pulled directions. Sensors 145*a–h*, when combined, provides detection of forces in all six axial directions (both directions on each of the X, Y and Z-axis). One or more pressure sensors (switches) provide sensing in each of the six directions. External housing 137 may have additional support (not shown) besides pressure sensors 145*a–h*, but such additional support must still allow external housing 137 to move sufficiently with respect to PDA 130 to allow the activation of pressure switches 145*a–h* when being supported by contact with an external object. The construction and placement of extendable arms 132*a–b*, arm release mechanisms 138, programmable activation controller 142, can all be the same as those seen in FIG. 8A.

In FIG. 8C, we see a schematic drawing of the circuit used to control extendable arms 132*a–b* in FIGS. 8A–B. The circuit in FIG. 8C can be used in any of the herein disclosed examples of the disclosed protection system. Motion sensor switch 100 is the same as seen in FIG. 7 and provides an automatic means for activating the disclosed protection system. Many other activation circuits can be used, this just one of the simplest. Activation controller 142 provides central control for the protection system circuit 140. Protection system circuit 140, comprises an activation controller 142, one or more pressure sensors 145*a–h*, acceleration switch SW2, and other sensors 148 which can comprise any of a number of optical, acoustical, inertial and other types of sensors. Pressure sensors 145*a–h* and arm release mechanisms 138 are connected to controller 142 by wires or other communication means, to provide sensing and activation of sensors 145*a–h* and release mechanisms 138, respectfully. Additional sensors 148 can be used with the pressure sensors 145*a–h* and can comprise any number of motion, acceleration, remote sensing and other sensing devices that can assist the pressure sensors with determining if the protected system is in a state of free-fall. Pressure sensors 145*a–h* can also be designed to detect force coming from the side, not just pushing and/or pulling as is common for mechanical switches. With the inclusion activating in response to side force, a single pressure switch could be used to detect pressure between PDA 130 and external housing 137, or other external housing, from any direction. In this way, the use of multiple multi-axis pressure switches provides redundancy and many of the switches can fail and the protection system remains operational. The protection circuit in FIG. 8C can be generally be mounted with other components of the device it is integrated with. For the case of PDA 130, pressure sensors 145*a–h*, controller 142, and arm release mechanisms 138 can all be mounted to the same circuit board used to house the PDA's circuits. Pressure sensors 145*a–h*, controller 142, and arm release mechanisms 138 can all be made very small so that they take up very little space on the PDA's circuit board(s).

In FIG. 8C, an acceleration switch SW2 also exists as an alternative acceleration sensor for detecting free-fall conditions. Switch SW2 can replace other more expensive inertial measuring systems, such as accelerometers and other inertial guidance systems. Acceleration switch SW2 can also be used without pressure sensors 145*a–h* to provide acceleration data to controller 142. Note that more than one acceleration switch SW2 can be used with the circuit (only one acceleration switch SW2 is shown here because of space limitations). Switch SW2 comprises a conductive casing (marked by SW2), a spring 144 and a weight 143 on the end of spring 144. Many standard acceleration switches like this are already in production and many of those designs could be used. Acceleration switch SW2 can be the same as switch SW1 and provide data about the movement of the portable device it is installed in. Because the acceleration needed to activate SW1 is only 0.02 gees, nearly any movement of SW1 can cause it to complete the circuit and send a contact signal to controller 142. However, switch SW2 would normally be designed to have a spring 144 considerably weaker than that needed to overcome gravitational acceleration. In other words, spring 144 would have a small enough spring constant that weight 143 would cause switch SW2 to close the circuit just resting in a gravitational field (9.8 m/s$^2$, 1.0 gee).

Spring 144 can work well with a number of different spring constants. Typically, spring 144 would be given a spring constant based on the size of weight 143, such that, its switching acceleration is less than one gee of acceleration (9.8 M/s$^2$, 1.0 gee). That is, the inertial acceleration field needed to bend spring 144 and weight 143 against the side of the switches casing (casing marked by SW2) is less than one gee (9.8 m/s$^2$). A typical spring constant might be used that allows weight 143 to lift off and disconnect from its casing when the experienced inertial acceleration drops below 4.9 m/s$^2$, 0.5 gee). Such an acceleration switch would have a switching acceleration or switch over acceleration of 4.9 meters per second squared. With switch SW2 requiring only one-half gee of acceleration, the only time switch SW2 would not be activated (weight 143 not in contact with its casing) would be when movement switch SW2 causes the weight to move away from its outer casing (marked by SW2). Because of the small distance between weight 143 and the insides of the switches casing, it takes very little time for the weight to move from one side of the casing to other. Thus, switch SW2 can only be in a non-conductive state (open circuit) for very small periods of time during normal movement of the portable device in which it is installed. However, if the portable device is dropped (in free-fall), suddenly there is no gravitational field pulling on weight 143, and spring 144 quickly moves weight 143 away from its casing (marked by SW2), opening the circuit, and moving to the center of the casing. If a dampening fluid is used within the switches casing (i.e. oil solution, etc.) to dampen out vibration, weight 143 can quickly be dampened so that it does not reconnect with the casing while in a free-fall condition. Thus, switch SW2 becomes a sensor that can detect if the portable device, is being supported by anything, both with the vibration that occurs during use and with the substantially constant activated state of switch SW2 when supported in a gravitational field.

Operational Description—FIGS. 1 through 5B, and 7

Operation of the disclosed impact protection system is completely automatic from the user's point of view. The system operates without user knowledge and is designed to activate whenever it is needed. Circuits within the device can sense when it is being used so that the impact protection system is active any time it is being moved and/or used. For the user, the device behaves just a normal electronic device until it is dropped.

In FIGS. 1 through 1B, we see the impact protection system installed in a PDA. In FIG. 1 the PDA is shown being dropped from a user's hand H at position D1. PDA 20 continues to drop without any change until it gets to position D2. At position D2, after about one foot of free-fall, activation controller 32 (see FIG. 1B) senses that it has been in free-fall too long and sends an activation signal to solenoids 34 to release arms 22. Spring tension within the arm hinges 26 causes the arms to rapidly spring out into position 22*a*. In their extended position, the arms are arranged so that they strike the floor or other solid object before the body of the device 20. A configuration of eight arms can provide complete 360 degree protection against impact against a flat surface. With arms 22 extended, PDA 20 continues to drop until it strikes surface 24. Resiliencies in the extended arms absorb the impact of the falling PDA. Some of this energy is stored in the elasticity of the arms and the PDA rebounds off surface 24 and may bounce several times before coming to rest at position D3. The resilient nature of the arms absorbs impact energy, greatly reducing the peak acceleration exerted on the device and thus greatly reducing the impact forces. The user can then retrieve their PDA. By simply rotating the arms back into their storage slots 27 arm catches 29 are snapped back into place within latching mechanism 34. The latching system holds arms 22 in their retracted position until the next time the PDA is dropped.

In FIGS. 2 through 2B, we see an impact protection system installed on another PDA 40. In this example, corner bumpers 42*a–b*, four pair in all, are shown in their retracted position in FIG. 2. During free-fall an activation controller (not shown), similar to either controller 32 in FIG. 1, and controller 112 in FIG. 7, detects free-fall conditions that cause it to release arm catches 46*a–b* from latch holes 48*a–b*, respectfully (latching mechanism itself not shown). Spring biasing from springs 44*a–b* extend corner bumpers 42*a–b* to their positions shown in FIGS. 2A and 2B. In this position, arm bumpers 42*a–b* will impact a flat surface before the main body of PDA 40. This is because the extension springs place bumpers 42*a–b* in such a location that flat surface impacts coming from the X, Y and Z-axis, or any other direction, will strike the bumpers before they can strike the body of PDA 40. This impact with the bumpers causes compression of springs 44*a* and/or 44*b*, which absorb impact energy and slow PDA 40 before the body of the PDA strikes the impact surface. After the user retrieves the fallen PDA, each bumper is pushed back into its retracted position by hand. Catches 46*a–b* slide into latch holes 48*a–b* and latch into place bumpers 42*a–b*, respectfully. Springs 44*a–b* are compressed behind bumpers 42*a–b* respectfully, to prepare PDA 40 for the next time it is dropped.

In FIG. 2C, cellular phone 150 provides impact protection is essentially the same way as PDA 40 in FIGS. 2A–B, except instead of providing corner bumpers, the sides of the device extend to provide protection. One could make the argument that arms 156 are actually corners of the phone, but the arms 154 and 156 essentially extend around the entire portable device (PDA 150), thus the sides of the PDA must also be covered by the arms. Activation of the extendable arms would be similar to other examples given in this patent. After extending to the position shown in FIG. 2C, the user would push arms 154 and 156 back into there respective places against the sides of PDA 150 with connectors 158 locking into place within latches 159 under each extendable arm.

In FIGS. 3A and 3B, we see a third example of an impact protection system. This design is built into the corner of a laptop computer, but can just as easily be built into any other portable device that may need impact protection. In this example, extendible arms 54 are stowed in a flat recesses 52 in the top and bottom surfaces of laptop 50. When the laptop detects a predetermined dangerous free-fall condition, latching mechanism 58 (only entrance hole shown) releases catch 60, which allows spring loaded hinges 56 (only top of hinge showing) to extend arms 54 and 54a to the positions shown in FIG. 3B. The orientation angle between arms 54 and 54a is about ninety degrees, very similar to the directions of bumpers 42a and 42b in FIGS. 2A and 2B. At this angle is chosen so that arms 54 and 54a can absorb impacts coming at the shown corner by resiliency in the arm itself and also dampening within hinges 56. Arms 54 and 54a can have many with many other shapes and materials to provide the desired impact properties. A square shaped arm with three flexible corners similar to flexible corners 64 on arm 54a would work well. For a laptop, hinges 56 can be reinforced to prevent breakage and stiffened biasing to provide a reasonable amount of energy absorption, such as, being able to absorb the energy in a five-foot drop without the case of laptop 50 striking the surface. After the impact is over, the user simply rotates arms 54 and 54a (and the other corners which may include the corners on the screen section) back into their recesses 52 with catch 60 latching then into place. Arms 54 can have many different designs, for example, it may be simply a wire-frame design, with a somewhat round shape, so that the wire-frame arm itself provides spring action. Also placement of arm 54 as shown in FIG. 3A can allow laptop speakers to be placed under the arm. Perforations in arm 54 would be added to allow the sound to exit from the speaker underneath, or another arm design, such as a wire-frame arm, can be used so that the area covered by the arm can still be used for what such space is normally used for (i.e. speaker output).

In FIG. 4 we see an alternative way of latching impact arms 72a–b and 74a–b on cellular phone 70. In this design, the arms for one entire side of the device (4 arms) are latched by a single latching mechanism 78. When dangerous free-fall conditions are detected latch 78 is actuated to release arm catch 76 on arms 72a–b and 74a–b. These arms being spring loaded quickly extend out to there extended position (see FIGS. 5A and 5b) similarly to arms 22 on PDA 20 (see FIGS. 1–1B). After use, the arms can be rotated back into their retracted position as shown in FIG. 4. The latching mechanism 78 may be designed to latch each arm one at a time or require all four arms (72a–b and 74a–b) to be pushed into their retracted position at the same time. The advantage of this type of arrangement is that fewer solenoid actuated latching systems are needed to release all the impact arms. This saves space and cost.

In FIGS. 5A and 5B we see, two examples of a dampening system for arm 74a from FIG. 4. Both FIGS. 5A and 5B are shown with arm 74a in its extended position and its retracted positions 75a shown in shadow.

In FIG. 5A the dampening system functions as arm 74a rotates from position 75a to the position shown. Lock pin 84 generates friction from contact with the outer surface of hinge hub 80. Thus as arm 74a rotates out, energy is dissipated by the rubbing contact between pin 84 and hub 80. When the fully extended position is reached pin 84 clicks into notch 85 and is stopped there. The notch and pin configuration creates a high friction point in the rotation of the arm. When the arm impacts an object force will build up to a point and then arm hub 80 will break free from pin 84 and begin to rotate under the forces exerted on it by the impact. Friction between hub 80 and pin 84 absorb some of the impact energy to reduce bounce of the device. Alternatively, pin 84 may be connected to a stiff dampening mount that can move with notch 85 as the arm rotates under impact. The stiffening mount in this case would absorb the impact energy directed in the direction of hinge motion. Pin 84 would be modified from what is shown so that it does not slip easily out of notch 85. This may require a button release on pin 84 so that it can be disconnected from notch 85 so the arm may be rotated back into its retracted position.

Alternatively, pin 84 can be designed to lock into place in notch 85 so that arm 74a can not rotate about its axis once deployed, and is only released by disengaging pin 84 from arm 74a. A release button or other release mechanism can be used to disengage pin 84 from notch 85 so that arm 74a can be rotated back to its stowed position (see FIG. 4) and prepare the impact protection system for another free-fall accident.

In FIG. 5B we see another method of dampening impact energy exerted on arm 74a. The dampening system comprises a friction plate 86, and a force means 87 for forcing hub 80 and plate 86 together in a controlled manner. When released from position 75a, arm 74a rotates toward the position shown. Friction between plate 86 and hub 80 absorb energy from this motion and slow the arm down in such a way that it stops at its extended position. It may be desirable to have force means 87 increase after reaching its extended position to allow lighter spring action for extending the arms. Friction instead of hinge biasing would provide the majority of the impact energy absorption.

In FIG. 7 we see, one possible circuit configuration for an impact protection system. When the device it is installed on is not being used free-fall detection, circuit 110 is off, and motion detector switch 100 is in standby mode. When a user picks up the device, acceleration switch SW1 detects this movement by closing contact between its central spring and the outer conductive can. This contact sends current to charge capacitor C1, which is quickly charged because of very low resistance. The positive voltage on JFET Q1 charges its gate and current begins flowing into free-fall detection circuit 110, powering-up the circuit, and making it ready to detect dangerous free-fall conditions. The charge stored in C1 from the momentary contact within acceleration switch SW1 keeps JFET Q1 open and power going to detector 110. The delay time for motion detector switch 100 can be a minute or more. Thus, a single, slight movement every minute or so can keep power going to detector 110. Motion sensor switch 100 is designed to greatly reduce power requirements compared to the impact protection system if detection circuit 110 remains on all the time.

In FIG. 7, once power is being supplied to impact protection circuit 110 by motion detector switch 100, the protection system is active and activation controller 112 receives data from sensors 114, 116 and 118. Controller 112 compares the received sensor information and compares it to preprogrammed criteria. When a sensor pattern corresponding to a dangerous free-fall condition is identified, activation controller 112 outputs a signal to arm release mechanism(s) 120 to release extendable arms that provide impact shock absorption. Many kinds of sensors and types of sensor criteria can be used determine if a dangerous free-fall condition potentially exists. Examples of some of these sensor criteria are discussed elsewhere in this patent.

In FIGS. 8A and B, we see PDA 130 with a free-fall impact protection system comprising, pressure switches 145a–h, programmable activation controller 142, arm activation mechanisms 138, extendable arms 132a–b detection system, and external housing 133 in FIG. 8A and external housing 137 in FIG. 8B. During normal operation one or more of the pressure switches 145a–h will be activated by contact of the user's hand with the housing of PDA 130 and/or external housing 133 or 137. The substantially continuous activation of at least one of the eight pressure switches at any particular moment, keeps the impact protection system from deploying the extendable arms 132a–b. Extendable arms 132a–b will not immediately extend when activation controller 142 senses none of the pressure switches being activated. Instead, controller 142 will be programmed to wait a predetermined period of time before determining that a dangerous free-fall condition exists and deploys the extendible arms. If at any time during this predetermined period of time, a pressure switch is activated, the time period can be reset, or adjusted depending on how long the pressure switch is activated, and how many switches are activated. More advanced programming can be used to take into account the amount of time these intermittent activations take place over and determine if a dangerous free-fall is taking place, such as, might occur if the user is bumping into the device as it falls, trying to catch it. The use of accelerometers and other sensors can provide even more information on what is happening to the protected portable device, and aid in determining when a dangerous free-fall condition actually exists.

In FIG. 8A, housing 133 wraps partially around the sides PDA 130. Gravitational force on housing 133 and PDA 130 will tend to always be activating at least one pressure switch mounted between them if the portable device is being supported (not in free-fall). Different pressure switches will be activated depending on the orientation of the portable device, but at least one and often many should be active at any given moment. For example, when the PDA is resting on a surface face-up as shown in FIG. 8A, pressure switches 145g and 145h are activated by the weight of PDA 130 within external cover or housing 133. If PDA is flipped over onto its face, the same two pressure switches 145g–h are activated but this time by the weight of external housing 133. In a similar way, the switches on each side of the PDA are activated by the weight of either PDA 130 or external housing 133, or both. This type of contact detection system can be combined with a vibration or motion sensor, or other acceleration detection devices to assist in determining when the portable device (PDA 130 with impact protection system) is in free-fall. In free-fall all contact sensors (pressure sensors) would become inactive, and a motion sensor would stop detecting motion since it would be sensing a constant zero acceleration in the inertial frame of reference of the PDA. The combination of the two sensor information can reduce the occurrence of false activations of the extendable arms.

In FIG. 8B, we see PDA 130 installed with external housing 137, which serves as both the back plate for the PDA and as an external contact sensor surface. Operation of the protection system in FIG. 8B is essentially the same as that for the protection system in FIG. 8A, except the pressure switches have a slightly different placement and orientation. Pressure switches 145a–h provide contact detection along all three axis just like in FIG. 8A. When PDA 130 is placed on its side, with no external objects touching external housing 137, the weight of external housing 137 is sufficient to depress the pressure switch corresponding to that orientation, and prevent a false free-fall condition from being detected. Thus, it is nearly impossible to support the PDA system in FIG. 8A without activating at least one pressure switch. Because the throw distance is small for pressure switches 145a–g in this design, the placement of the switches is critical so that misalignment does not cause opposing switch pairs forcing each other to activate.

The protection circuit in FIG. 8C can be used with pressure sensors 145a–h by themselves, or with one or more accelerations switches SW2, or the two types of sensors together. Motion detector 100 operates in a similarly to the way it operated in FIG. 7. The operation with pressure sensors 145a–h involves activation controller 142, continually monitoring sensors 145a–h to determine whether they are activated or not. For this example pressure sensors 145a–h will be typical pressure activated mechanical normally open switches, though many other kinds can be used. When none of the pressure sensors are activated (such as in free-fall), the controller continues monitoring pressure sensors 145a–h and also begins a timer, counting down to the activation of arm release mechanism(s) 138. If additional sensor readings reveal activated pressure sensors, the controller stops the count-down and continues just monitoring the pressure sensors. If however, none of the pressure sensors are activated again, the controller eventually reaches a predetermined period of time that the controller considers a dangerous free-fall condition, and activates release mechanism(s) 138, which releases active impact protection system.

If acceleration switch SW2 is used instead of pressure switches 145a–h, the external housing 133 and 137 can be eliminated from the PDA designs seen in FIGS. 8A–B. When a portable device containing the circuit in FIG. 8C is picked-up, motion sensor circuit 100 is activated and turns on the impact protection circuit 140, and may also turn on the portable device. With protection circuit 140 activated, controller 142 begins monitoring acceleration switch SW2. During normal operation switch SW2 is electrically closed due to gravity pulling weight 143 against the casing of the switch. If the portable device is moved violently, weight 143 may move from contact with the casing thus opening the circuit controller 142 is monitoring. When this happens controller 142 begins a timer to determine the length of time switch 144 is open (not activated). If the change in state of switch SW2 was caused by vibration or movement of the portable device in the user's hand, the period of time switch SW2 is open is very small, since it can swing over to the other side of the casing and activating the switch again, and gravity would then quickly pull the weight back into contact with the bottom side of the casing again activating switch SW2. Thus, under these vibrating conditions the period of time switch SW2 is not conducting is very small. However, if the user drops the portable device containing protection circuit 140, inertial acceleration suddenly falls to substantially zero, and weight 143 swings way from the casing of switch SW2 deactivating the switch. Spring 144 is biased to move weight 143 to the center of the casing, in the absence of gravitational or other inertial forces. Since very little inertial forces exist in free-fall switch SW2 remains open. If a dampening fluid (possibly just air if switch SW2 is made small enough) then weight 143 will very quickly be centered in the switches casing. This extended none activated condition of switch SW2 is detected by controller 142 and after a predetermined period of time with none of the acceleration switches activated, would consider the portable device in a dangerous free-fall condition and signal arm release mechanism(s) 138 to release the impact protection devices, such as extending spring loaded arms or pads.

Activation Modes

Many different activation modes exist for free-fall detector 110. Depending on how activation controller 112 determines when a "dangerous free-fall" is occurring many different criteria can be important for use in determining if the impact arms need to be extended or not. The following twelve examples show some of the possibilities.

1) The first activation mode criteria is to simply use an acceleration sensor that can detect near zero net acceleration. When a device is dropped the acceleration in the sensors frame of reference (device's inertial frame of reference) becomes zero all the time it is free-falling (not counting air friction). The impact protection system would deploy an impact absorbing arms (wire arms, pads, plates, coils, bumpers, etc.) when a near zero acceleration is detected for a predetermined period of time. To keep impact energies low, this time period should be small. However, to reduce false activations having the time period longer is beneficial. A good compromise between the two is around one-quarter second, which corresponds to about a one-foot free-fall. The corners of the device can be lightly padded to be able to sustain a one-foot drop. Dropped from a larger height and the impact arms would extend to catch the device. This drop distance can be reduced, since free-fall conditions are difficult to reproduce by a user handling the device without actually dropping it. A device in free-fall will have an inertial acceleration field that is substantially zero, except for possible rotational effects resulting from the sensor is not being located at exactly the center of mass of the device, and extremely small amounts of air friction at the velocities we are dealing with here. In most impact protection designs, rotational accelerations and air friction can be ignored by properly positioning the acceleration sensor. The result is a very stable (very little variation in acceleration) zero acceleration frame of reference for the sensor, which is very hard to duplicate by a user in any other way than dropping the protected device. Thus, the device may be designed to activate its impact protection as soon as possible after detecting the device is in a stable free-fall.

2) For this mode a more complex and sensitive three-axis accelerometer 114 can be used along with a three-axis gyroscope, to keep track of the velocity of the device in the vertical direction (that is falling direction). When a predetermined downward velocity and/or other velocity directions exceed the maximum values considered "safe" in those directions, the activation controller 112 would activate release mechanism 120 to extend the arms. A typical vertical velocity for activation may be eight feet-per-second (this occurs in approximately one-quarter second of free-fall from a stationary position).

3) This mode involves an impact protection system for portable equipment which keeps track of the free-fall velocity similar to mode 2), but also detects to see if acceleration is also near zero. By detecting near zero acceleration the system becomes less prone to fall activations because a user will very rarely move the device so that it has near zero acceleration for a substantial period of time. Thus, the user can still move the device quickly without worrying that the velocity may set off the impact protection system.

4) This mode involves detecting both low acceleration in the inertial frame of the device, and also very-low rates of change in acceleration (approx. constant acceleration) for a predetermined period of time (i.e. 0.25 seconds). Any vibrations within the device can be designed to be dampened out quickly or filtered out by the system, since these vibrations passing through the acceleration sensor and qualify as changes in acceleration. This combination does not require gyros only a three-axis accelerometer. The accelerometer would detect very small changes in acceleration such as, vibrations and motion from handling, carrying, etc. to reduce the chances of false activation. Combined with detecting when acceleration itself is near zero provides two conditions that normally never occur unless the device is in free-fall. To reduce cost, a two-axis accelerometer could be used, but could activate if held at exactly the right angle without moving it. This problem is alleviated if the accelerometer is very sensitive so it always detects movements made by a user, and angling the two-axis accelerometer so that the device cannot be laid down with the two-axis perpendicular to gravity. This can be done by placing the accelerometer off axis with all the axis of the device so that no matter what edge the device may be rested on, the accelerometer's sensing axis' will not both be perpendicular to gravity at the same time. A slight directional difference of two accelerometers on the same IC is all that would be needed to detect the presents of a gravitation acceleration field and changes in acceleration (detecting movement caused by the user).

5) This mode releases the impact arms when the following three conditions are detected at the same time: 1) low acceleration in the inertial frame of the device, 2) very-low rates of change in acceleration (approx. constant acceleration, and almost no vibrations), and 3) a vertical velocity and/or total velocity that is greater than a predetermined threshold velocity are met. One or more of these conditions existing for a predetermined period of time then the controller can still initiate activation of the impact protection system.

6) This mode uses a capacitive sensor circuit for detecting changes in capacitance of the device's case (housing) and combines this information with a free-fall detection circuit. The capacitive detector would preferably have the device's case be conductive so direct contact of the user is easily detected. A capacitance checking circuit within the detection system can measures the capacitance of the device's case. When the device is in free space it will have a minimum capacitance. As conductive objects get near it (like a user), the capacitance will rise. And when a conductive object is touching the conductive case of the device, the capacitance will be much greater than the device's capacitance in free space. Thus, the capacitance value can be used to determine when the device is, or is not, in contact with a user, and possibly even be used to determine the approximate distance the device is from a user. Thus, the system can be designed to activate only when a user is not in contact with the device so that it has its free space capacitance (i.e. in free-fall). The capacitance value does not give enough information on its own to determine when to activate, because laying the device on a none conductive table can give it a capacitance very near it free space capacitance. Thus, a free-fall detection circuit can also added to detect when the device is in free-fall. The advantage of this mode is that the impact absorbing system can be activated sooner than some of the above modes, since being in a free-fall and not in contact with anything can be identified as a dangerous situation immediately.

7) This mode both a capacitive sensor circuit (for detecting changes in capacitance of the device's case and a velocity detection circuit for determining the approximate instantaneous velocity of the device. These two sensors provide sufficient information to reliably determine when a device is in a dangerous free-fall situation. Activation would occur within a predetermined period of time after the free-space capacitance of the device is detected and the instantaneous velocity is above a predetermined threshold. An impact absorbing system would be extended upon detection these conditions.

8) This mode uses three different information types to determine if the impact protection system should be activated. The three information sources are: 1) a capacitive sensor circuit for detecting changes in capacitance of the device's case, 2) a velocity detection circuit for determining the approximate instantaneous velocity of the device, and 3) a free-fall detection circuit for detecting when the device is in free-fall (low inertial acceleration). In many cases 2) and 3) can be determined from the same accelerometers and gyro system, while 1) would be determined by a capacitance measuring circuit.

9) This mode uses three different information types to determine if the impact protection system should be activated. The three information sources are: 1) a capacitive sensor circuit for detecting changes in capacitance of the device's case, 2) a change in acceleration detection means for determining if the acceleration is changing (accelerations other than the constant gravitational acceleration, and 3) a free-fall detection circuit for detecting when the device is in free-fall. The means for detecting the change in acceleration of the device in its inertial frame of reference may be provide by the same circuit that provides free-fall detection since both can be obtained with an accelerometer. The impact absorbing system would extend upon detection of a predetermined set of conditions for capacitance, acceleration, and/or changes in acceleration.

10) This mode uses four different information types to determine if the impact protection system should be activated. The four information sources are: 1) a capacitive sensor circuit for detecting changes in capacitance of the device's case, 2) a change in acceleration detection means for determining if the acceleration is changing (accelerations other than the constant gravitational acceleration, 3) a free-fall detection circuit for detecting when the device is in free-fall, and 4) a velocity detection circuit for determining the approximate instantaneous velocity of the device. The impact absorbing system would be activated upon detection of a predetermined set of conditions for capacitance, velocity, acceleration, and/or rate of change in acceleration (mathematical derivative of acceleration with respect to time).

11) This mode uses a location sensors, such as an ultrasonic range finders or similar devices which can detect surfaces that are closing on its position. By tracking these surfaces a controller can determine the closing velocity of any surface coming toward it. If the closing velocity is sufficiently great the impact protection system would be activated and the impact arms deployed. Because of active sensing, the controller could just activate the impact absorption system on that side which is going to make contact.

12) This mode combines a set of location sensors as in 11) and combines them with any of the other modes to determine dangerous impact situations. Activation of the impact protection system would occur when closing velocities and distances from the closing object are above a predetermined threshold or threshold(s).

RAMIFICATIONS, AND SCOPE

The disclosed impact protection system protects portable devices by extending shock absorbing arms from the body of the device out and away from the body. This extension away from the device's body provides a greater distance for de-acceleration of the device on impact. This results in much lower impact forces and accelerations, thus protecting the device from damage.

Although the above description of the invention contains many specifications, these should not be viewed as limiting the scope of the invention. Instead, the above description should be considered illustrations of some of the presently preferred embodiments of this invention. For example, only devices with four corner pairs are discussed, however other shapes of devices are possible such as a triangular device with three corner pairs, or an open laptop computer which has six corner pairs (4 corners on the base and 2 extra corners on the unattached sides of the screen section). Fold out cellular phones also have six corner pairs. The numbers of impact arms are thus not limited to eight and can be greater in number or less in number if desired. Each corner can have nearly any number of separate extendible arms from zero on up (zero in the case of side mounted extendable pads or arms—see FIG. 2C). The impact protection system can also be used on normally non-electronic devices, such as brief cases or shipping containers to protect delicate contents. Also, there are a host of other remote sensor devices that could be used to provide collision warning signals to the activation controller, such as, ultrasonic sensors, laser rangefinders, visual sensors, etc. Also, the shape of the shock absorbing arms can be modified into any of a number of shapes and configurations. For example, a notebook computer (or other device) could include padded hand-grips on the sides, corners, and/or edges, which extend when activated during free-fall. The handgrips could serve three functions for this example: 1) as a handgrip for the user, 2) as a padded bumpers to protect against minor drops and knocking about of the notebook (impact protection system not activated), and 3) as the extendible impact surface for an impact protection system, which extends outward away from the notebook in preparation for an impact. This same type of bumper system could be used on any of the other portable devices discussed in this paper. Also, additional ways exist for extending the resilient arms, which can include sliding out of a recess in the housing of a portable device.

Thus, the scope of this invention should not be limited to the above examples but should be determined from the following claims.

I claim:

1. An impact protection system for a portable device, comprising:
   a) a housing;
   b) a impact absorbing means attached to said housing and having a retracted position and an extended position;
   c) an extension means connected to said impact absorbing means for providing forceful extension of the impact absorbing means from said retracted position to said extended position;
   d) a free-fall detection means defined within said housing for detecting a dangerous free-fall conditions of the portable device;
   e) an activation means responsive to said free-fall detection means for activating said extension means and extending the impact absorbing means from its retracted position to its extended position, whereby the dangerous free-fall condition is detected, the impact protection system activates the impact absorbing means to provide impact protection for the portable device.

2. The impact protection system in claim 1, wherein;
   said impact absorbing means comprises a plurality of resilient arms.

3. The impact protection system in claim 2, wherein;
the resilient arms are pivotally mounted to said housing, and designed to pivot between its retracted and extended positions.

4. The impact protection system in claim 2, wherein;
said resilient arms are slidably mounted within one or more recesses on said housing, and designed to slide linearly out of said recesses from its retracted position to its extended position.

5. The impact protection system in claim 1, wherein;
the impact absorbing means comprises a plurality of spring loaded bumpers designed to extend outward from their retracted positions to their extended positions when activated.

6. The impact protection system in claim 1, wherein;
the free-fall detection means comprises an accelerometer designed to substantially detect the lack of gravitational acceleration during free-fall in the inertial frame of reference of the portable device, whereby a substantially zero detected acceleration causes the activation means to extend the impact absorbing means after a predetermined period of time.

7. The impact protection system in claim 1, wherein;
the free-fall detection means comprises an acceleration switch having a switching acceleration substantially less than Earth's gravitational acceleration.

8. The impact protection system in claim 1, wherein;
the free-fall detection means comprises one or more pressure sensors defined on the portable device's exterior surface, wherein the pressure sensors are designed to detect physical contact with an external object, whereby the dangerous free-fall condition is determined to exist when all the pressure sensors are not detecting contact with any external objects.

9. The impact protection system in claim 8, wherein said pressure sensors are defined by one or more strain gages, whereby the strain gages can detect the lack of gravitational force between the external housing and the portable device which occurs during free-fall.

10. A method of protecting a portable device from free-fall impact damage, comprising the steps of:
1) detecting if the portable device is in a dangerous free-fall condition;
2) extending an impact absorbing means attached to the portable device outward from the portable device's exterior surface when the existence of the dangerous free-fall condition is detected, wherein the impact absorbing means when extended is designed to substantially make contact with an impact surface before any other portion of the portable device and absorb impact energy.

11. The method of protecting a portable device, according to claim 10, wherein:
step 1) further comprises measuring the net acceleration in the inertial frame of reference of the portable device, and step 2) further comprises determining if the measured net acceleration represents a dangerous free-fall condition.

12. The method of protecting a portable device, according to claim 11, wherein:
the dangerous free-fall condition is determined by comparing the measured net acceleration with a predetermined threshold value, whereby the impact absorbing means is extended when the measured acceleration is determined to be below said predetermined threshold value for a predetermined period of time.

13. The method of protecting a portable device, according to claim 10, wherein:
step 1) further comprises measuring the net acceleration and the rate of change in the net acceleration in the inertial frame of reference of the portable device, and step 2) further comprises determining if the combination of the measured net acceleration and the measured rate of change in the net acceleration represents a dangerous free-fall condition.

14. The method of protecting a portable device, according to claim 10, wherein:
step 1) further comprises calculating the free-fall velocity of the portable device by integrating the measurement of acceleration over time, and step 2) further comprises determining if the combination of calculated free-fall velocity and/or measured acceleration represents a dangerous free-fall condition.

15. The method of protecting a portable device, according to claim 11, wherein:
step 1) further comprises measuring the rate of change in acceleration and determining the free-fall velocity of the portable device by integrating the measurement acceleration over time, and step 2) further comprises determining if the measured rate of change in acceleration and/or the free-fall velocity represents a dangerous free-fall condition.

16. The method of protecting a portable device, according to claim 11, wherein:
step 1) further comprises measuring a capacitance of a conductive portion on the portable device's exterior surface, whereby it can be determined if a user is touching the portable device, and step 2) further comprises determining that the portable device is in a non-dangerous condition if the measured capacitance of the portable device's exterior surface determines that the user is touching the portable device, whereby the non-dangerous condition remains in effect while the user is touching the conductive portion.

17. The method of protecting a portable device, according to claim 11, wherein:
step 1) further comprises measuring a capacitance of a conductive portion on the portable device's exterior surface, whereby it can be determined if a user is touching the portable device, and step 2) further comprises processing the combination of capacitance measurements and acceleration measurements over time to determine if the portable device is in a dangerous free-fall condition, whereby the impact absorbing means is extended even if the user fumbles it as it falls.

18. The method of protecting a portable device, according to claim 10, wherein:
step 1) further comprises detecting the existence of an external solid object in physical contact with the portable device's exterior, whereby existence of physical contact with the object can be used to determine if the portable device is supported and not falling, and step 2) further comprises determining that the dangerous free-fall condition exists if no physical contact with the portable device's exterior is detected for a predetermined period of time, whereby the impact absorbing means is activated when there is a lack of external physical contact with the portable device for a predetermined period of time.

19. The method of protecting a portable device, according to claim 18, wherein:
the physical contact of the portable device with external object comprises measuring the capacitance of a conductive portion of the portable device's exterior surface, wherein the presents of an object is determined when the capacitance of the conductive portion is different from the capacitance when it is unsupported or free-falling.

20. A method of protecting a portable device from impact damage, comprising the steps of:
1) detecting if an external object is in physical contact with the portable device's exterior to provide support, wherein if no external physical contact is detected for a predetermined period of time the portable device is considered to be in a dangerous free-fall condition, and
2) extending an impact absorbing means attached to the portable device outward from the portable device's exterior surface when the existence of the dangerous free-fall condition is detected, wherein the impact absorbing means when extended is designed to substantially make contact with an impact surface before any other portion of the portable device and absorb impact energy.

21. The method of protecting a portable device, according to claim 20, wherein:
detecting physical contact of the portable device with an object is accomplished with one or more pressure switches attached to the exterior of the portable device.

22. The method of protecting a portable device, according to claim 10, wherein:
the dangerous free-fall condition is determined by remotely sensing an object moving toward the portable device.

* * * * *